United States Patent

Tatsumi et al.

Patent Number: 5,292,487
Date of Patent: Mar. 8, 1994

[54] CZOCHRALSKI METHOD USING A MEMBER FOR INTERCEPTING RADIATION FROM RAW MATERIAL MOLTEN SOLUTION AND APPARATUS THEREFOR

[75] Inventors: Masami Tatsumi; Shin-ichi Sawada, both of Hyogo, Japan

[73] Assignee: Sumitomo Electric Industries, Ltd., Osaka, Japan

[21] Appl. No.: 865,040

[22] Filed: Mar. 31, 1992

[30] Foreign Application Priority Data

Apr. 16, 1991 [JP] Japan .................. 3-083770
Aug. 22, 1991 [JP] Japan .................. 3-210786

[51] Int. Cl.⁵ .................................. B01D 9/00
[52] U.S. Cl. .......................... 422/249; 156/607; 156/DIG. 83; 422/246
[58] Field of Search ........... 156/607, 608, DIG. 83, 156/DIG. 88; 422/246, 249

[56] References Cited

U.S. PATENT DOCUMENTS

| | | | |
|---|---|---|---|
| 2,892,739 | 6/1959 | Rusher | 156/608 |
| 4,609,425 | 9/1986 | Mateika et al. | 156/DIG. 83 |
| 4,894,206 | 1/1990 | Yamashita et al. | 422/249 |
| 4,938,837 | 7/1990 | Tada et al. | 156/608 |

FOREIGN PATENT DOCUMENTS

| | | |
|---|---|---|
| 57-7897 | 1/1982 | Japan . |
| 60-81089 | 5/1985 | Japan . |
| 60-118699 | 6/1985 | Japan . |
| 60-172772 | 11/1985 | Japan . |
| 61-63596 | 4/1986 | Japan . |
| 62-288193 | 12/1987 | Japan . |

*Primary Examiner*—Olik Chaudhuri
*Assistant Examiner*—Felisa Garrett
*Attorney, Agent, or Firm*—W. G. Fasse; W. F. Fasse

[57] ABSTRACT

A Czochralski method using radiation intercepting members (1, 9) is used for manufacturing a single crystal such as compound semiconductors with a high production yield using a material having a low thermal conductivity or with a small temperature gradient in the pulling direction. In this method, a coracle (6) having an opening is provided in a melt contained in a crucible (3). A first member (1) is positioned on the coracle (6) to intercept heat radiation from the melt. A second member (9) supported by a crystal pulling shaft (8) is positioned on the first member (1) to cover an opening formed at the center of the first member (1). Seeding is performed while heat loss is limited by intercepting the radiation with the first and the second members. After the seeding, a shoulder portion of a single crystal is formed while heat loss is still limited while intercepting the radiation with the members (1, 9). A cylindrical body of the single crystal is pulled by the shaft (8) which also lifts the members (1, 9).

14 Claims, 19 Drawing Sheets

# CZOCHRALSKI METHOD USING A MEMBER FOR INTERCEPTING RADIATION FROM RAW MATERIAL MOLTEN SOLUTION AND APPARATUS THEREFOR

FIELD OF THE INVENTION

The present invention relates to a method and an apparatus for manufacturing a single crystal by using the Czochralski method and, more specifically, it relates to a method and an apparatus for manufacturing, in accordance with the Czochralski method, a single crystal of a III-V compound semiconductor such as GaAs and InP, of a II-VI compound semiconductor such as CdTe, of a semiconductor such as Si, and Ge, of an oxide such as $LiNbO_3$, $TiO_2$ and BSO.

BACKGROUND INFORMATION

In manufacturing a single crystal in accordance with the Czochralski method, a technique for controlling the diameter of the single crystal to be formed and for controlling the shape of the solid-liquid interface is very important to form the single crystal with the required stability while suppressing the generation of crystal defects such as dislocation, the formation of a polycrystal or a twin crystal. Methods and apparatuses employing a member for carrying out such control in a crucible containing raw material molten solution for pulling the single crystal by means of this member have been developed for the Czochralski method.

For example, Japanese Patent Laying-Open Nos. 57-7897 and 61-63596 disclose apparatuses in which a molding body having an opening at the center is provided above the raw material molten solution. In these apparatuses, the shape of the pulled crystal is controlled as the single crystal is pulled through the opening of the molding body.

Japanese Patent Laying-Open No. 62-288193 discloses a method in which a molding body having an inverted conical shape is dipped in the raw material molten solution contained in the crucible and the single crystal is pulled from the raw material molten solution flowing in the molding body. In said method, by moving the molding body and the crucible relative to each other, the cross-sectional area of the super cooled part of the molten solution formed in the molding body is changed. By adjusting the cross-section in steps for forming a shoulder portion, a cylindrical body and a tail portion are formed and a rapid growth of the crystal can be suppressed.

The inventors of the present invention have studied a method and apparatus in which a coracle having a communicating hole provided at the bottom floats on the raw material molten solution for pulling a single crystal from the raw material molten solution flowing through the communicating hole into the coracle. The coracle is used in the following manner, for example, in order to control the diameter and shape of the single crystal to be grown. Referring to FIG. 1(a), raw material molten solution 45 and liquid encapsulant 47 are contained in a crucible 43, and a coracle 46 is dipped therein. The coracle 46 is adjusted to have an appropriate specific gravity, so that it floats on the raw material molten solution. The raw material molten solution flows through a communicating hole 46a into the floating coracle 46. The surface area of the raw material molten solution in the coracle has an appropriate diameter. Referring to FIG. 1(b) an upper shaft 48 is lowered, and a seed crystal 42 provided at the lower end of the shaft is dipped into the raw material molten solution in the coracle 46. At this time, the temperature of the raw material molten solution is adjusted by means of a heater 44 provided around the crucible 43. Then, referring to FIG. 1(c), the upper shaft 48 is slowly elevated and a single crystal 10 is pulled.

The above described method and apparatus have been proposed to enable a stable growth of the single crystal. However, when a crystal is to be pulled by using a small temperature gradient in the direction of pulling, or when a crystal having a relatively low thermal conductivity is to be pulled, it is often difficult to manufacture such a crystal with a low dislocation density by the above described methods and apparatuses.

In the above described method or apparatus, emission of heat from the raw material molten solution is considered to be a major factor causing a higher dislocation density. In order to suppress heat radiation, various methods or measures have been proposed. For example, Japanese Utility Model Laying Open No. 60-172772 discloses a crystal pulling apparatus in which at least one heat intercepting plate is provided in the longitudinal direction of the shaft for pulling the crystal, in order to suppress heat convection from the raw material molten solution. Japanese Patent Laying-Open No. 60-81089 discloses a method in which an elongate crucible is used and a crystal is pulled while the raw material molten solution is covered by the sidewall of the crucible and a reflector for reflecting heat radiation is provided on a crystal pulling shaft.

Further, Japanese Patent Laying-Open No. 60-118699 discloses an apparatus including a member for suppressing heat radiation and heat convection from the raw material molten solution, through which member the crystal pulling shaft is provided above the crucible.

The conventional apparatus or method employing a member for suppressing radiation or convection enables manufacturing of a crystal with a low dislocation density. However, when the crystal is to be pulled with a temperature gradient that becomes smaller in the pulling direction, or when a crystal having a relatively low thermal conductivity is to be pulled, it was often difficult by such method or apparatus to suppress a rapid growth of the crystal especially at the start of the pulling. A rapid crystal growth causes the formation of twins or polycrystals and makes it difficult to manufacture a single crystal with a high reproducibility. Especially when a crystal of a material having a low thermal conductivity such as CdTe is to be pulled, it was difficult to pull the single crystal with a high reproducibility, because of the rapid growth at the start of the pulling.

When a crystal of GaAs or CdTe is to be pulled, the emission of heat from the raw material molten solution is an important cause of the rapid growth of the crystal while pulling takes place. The conventional apparatus and method could not sufficiently suppress the emission of heat during pulling the crystal. Most of the emission of heat is considered to be caused by heat radiation. Therefore, an effective interception of radiation was necessary to effectively suppress the heat emission. If the radiation is intercepted nearer to the raw material molten solution, heat emission can be more effectively suppressed. However, the mechanism for intercepting radiation at an upper portion of the crucible provided in the conventional apparatus is not effective enough, and it was necessary to intercept radiation near the raw material molten solution. Interception of the radiation is considered to be not sufficient even in the method or apparatus in which a shaft for pulling the crystal is lowered so as to bring the radiation intercepting member closer to the molten material when the prior art is trying to improve the suppression of the heat emission.

SUMMARY OF THE INVENTION

It is an object of the present invention to provide a method and apparatus in which radiation from the raw material molten solution can be effectively intercepted especially at the start of the pulling when the temperature gradient in the direction of pulling is small, thereby providing a sufficient suppression of the rapid growth of the crystal to be pulled and enabling the formation of a crystal with a low dislocation density.

It is another object of the present invention to provide a method and apparatus capable of sufficiently suppressing the rapid growth of a crystal and of forming a crystal with a low dislocation density, by effectively intercepting the heat radiation especially at the start of pulling when a single crystal of a material having a low thermal conductivity, for example CdTe, is to be pulled.

A further object of the present invention is to provide a method and apparatus for manufacturing a single crystal with a high yield, by effectively suppressing a rapid crystal growth.

One aspect of the present invention provides a method of forming a single crystal by bringing a seed crystal attached at a lower end of a crystal pulling shaft into contact with a raw material molten solution and by pulling the seed crystal by the crystal pulling shaft. The method of the present invention includes the following steps: providing, in the raw material molten solution, a coracle having an opening capable of containing the raw material molten solution therein so that the surface of the raw material molten solution has a prescribed size; first intercepting radiation by providing a first member having an opening for passing a seed crystal at the center to cover the surface of the raw material molten solution in the coracle, so as to intercept radiation from the raw material molten solution to the upper portion of the coracle; second intercepting radiation by covering the opening with a second member supported by the crystal pulling shaft when the seed crystal is brought into contact with the raw material molten solution, so as to intercept radiation through the opening; bringing the seed crystal into contact with the raw material molten solution for seeding by lowering the crystal pulling shaft while intercepting radiation by the first and second members; forming a shoulder portion in the single crystal by elevating the crystal pulling shaft while intercepting radiation by the first and second members following the seeding step and forming a cylindrical body after the shoulder forming step, whereby the single crystal is formed from the raw material molten solution in the coracle while pulling the first member and the crystal pulling shaft.

According to the present invention, from the first step of intercepting radiation to the step of forming the shoulder portion, radiation is preferably further intercepted by covering the first member by a third member provided above the first member and having an opening through which the second member is passed.

Preferably, the aforementioned first member should cover the raw material molten solution as close as possible to the surface of the raw material molten solution For example, if the first member covers the surface of the raw material molten solution within 50 mm above the surface of the raw material molten solution, radiation can be sufficiently intercepted.

The inner diameter of the opening portion of the first member should be as small as possible so as to effectively intercept the radiation from the raw material molten solution. More specifically, the radiation escaping from the opening portion can be reduced when the gap between the seed crystal and the first member $(D-d)/2$ is made smaller, where D denotes the inner diameter of the opening portion and d denotes the diameter of the seed crystal. On the other hand, this gap must be large enough to make sure that the seed crystal is smoothly passed through the opening even if the seed crystal should vibrate because of rotation or the like. From these viewpoints, the gap $(D-d)/2$ should preferably be in the range of 2 to 20 mm.

In the present invention, the heat radiation may be intercepted by a single member formed by integrating the first and second members.

Further, from the first step of intercepting radiation to the step of forming the shoulder portion, the radiation from the heat source may be applied to the surface of and above the raw material molten solution The above described method of the present invention is preferably carried out in accordance with the liquid encapsulated Czochralski method in which the single crystal is pulled with a liquid encapsulant provided on the raw material molten solution Further, the method of the present invention may be carried out under a pressurized atmosphere including a raw material constituent.

The method of the present invention is especially useful for forming a crystal having a low thermal conductivity, whereby single crystals such as a CdTe crystal, or a CdTe crystal containing as an impurity Zn, Se, Hg, Mn, In, Ga or Cl may be formed.

Another aspect of the present invention provides an apparatus for manufacturing a single crystal. The present apparatus includes a crucible for containing a raw material molten solution; a lower shaft for supporting the crucible; a heater arranged around the crucible; a coracle provided in the crucible and having a coracle opening capable of containing therein the raw material molten solution such that the surface area of the raw material molten solution in the coracle has a prescribed size; a rotatable and vertically movable upper shaft at the lower end of which a seed crystal for pulling a single crystal from the raw material molten solution is attached; a first radiation intercepting member having an opening at the central portion through which the seed crystal is inserted and which heat intercepting member is movable above the coracle to cover the surface of the raw material molten solution so as to intercept an upward heat radiation from the raw material molten solution in the coracle; and a second radiation intercepting member for covering the aforementioned opening supported by the upper shaft so as to intercept radiation through the opening of the first radiation intercepting member.

In the apparatus of the present invention, the coracle refers to a molding body containing the raw material molten solution provided in the crucible in order to control the diameter and the shape of the single crystal to be grown. Preferably, the coracle should be formed of a material which is stable at a high temperature, which does not react with the raw material molten solution and which does not contaminate the single crystal to be grown. The coracle may be formed of a material such as carbon, quartz, BN, PBN, AlN, PBN coated carbon, carbon coated by glassy carbon, or carbon coated by pyrolytic carbon. In the apparatus of the present invention, the coracle may be a float on the raw material molten solution in the crucible, or it may be fixed in the crucible to another member.

The apparatus in accordance with the present invention may include a third radiation intercepting member having an opening through which the second radiation intercepting member is passed for covering the first radiation intercepting member so as to further intercept heat radiation above the first radiation intercepting member. The aforementioned first radiation intercepting member preferably covers the raw material molten solution as close as possible to the surface of the raw material molten solution so as to get an improved heat radiation interception. If the first radiation intercepting member covers the surface of the raw material molten solution within 50 mm above the surface of the raw material molten solution for example, the heat radiation can be more effectively intercepted.

Further, in the apparatus of the present invention, the first and second radiation intercepting members may be integrated into one such heat radiation intercepting member.

The aforementioned first radiation intercepting member may be formed by stacking a plurality of disk-shaped members having openings of different diameters.

In addition, the inner diameter of the opening portion of the first radiation intercepting member should be as small as possible in order to effectively intercept the radiation from the raw material molten solution. Namely, if the gap $(D-d)/2$ between the seed crystal and the first member is made small, the interception is improved. In the foregoing gap definition D denotes the inner diameter of the opening portion and d denotes the diameter of the seed crystal. If both dimensions are as small as possible, heat radiation escaping from the opening portion is reduced. On the other hand, the gap should be large enough to enable the seed crystal to smoothly pass through the opening portion even if the seed crystal vibrates because of shaft rotation or the like. From the above points, the gap $(D-d)/2$ should preferably be in the range of 2 to 20 mm.

The above described radiation intercepting member should be made of a material which is stable at a high temperature, capable of intercepting heat radiation from the raw material molten solution, and it must not contaminate the single crystal to be grown. Materials for forming the member may be selected, for example, from carbon, pyrolytic graphite, BN, PBN, alumina, zirconia, quartz (opaque quartz), AlN, SiN, beryllia, Mo, W, Ta and composite materials of these materials. In order to improve the radiation intercepting effect, a material having a low thermal conductivity and a low emissivity should be selected out of the above list of materials.

The apparatus of the present invention preferably further includes a device for letting radiation from the heater to reach above and to the surface of the raw material molten solution. This device may be a window formed at an upper portion of the crucible for letting radiation from the heater reach above the surface of the raw material molten solution in the crucible. This window may be a simple opening with nothing fitted therein, or it may be fitted with quartz or PBN which transmits heat radiation easily and does not contaminate the raw material molten solution. As an alternative, a translucent ceramics such as quartz or PBN may be used at least at the upper portion of the crucible, so that the heat radiation from the heater can be radiated to the surface of and above the raw material molten solution in the upper portion of the crucible.

Further, a liquid encapsulant may be provided on the raw material molten solution in the apparatus in accordance with the present invention as described above. The apparatus of the present invention may include an air-tight container for pulling the single crystal in a volatile constituent atmosphere.

In the method or apparatus in accordance with the present invention, since the surface of the raw material molten solution in the coracle is covered by the first member mounted on the coracle, radiation from the raw material molten solution is intercepted except through the opening of the first member. Therefore, before seeding, most of the radiation can be intercepted. When the seed crystal is brought into contact with raw material molten solution, the radiation through the opening of the first member is intercepted by the second member supported by the crystal pulling shaft. Therefore, radiation from the surface of the raw material molten solution is substantially entirely intercepted. Further, when the seeding step is performed by lowering the crystal pulling shaft so that the seed crystal contacts the molten solution, the second member covers the opening of the first member, and accordingly, the radiation is kept intercepted. During the shoulder forming step after seeding, the entire radiation is substantially intercepted by the first and second members. By starting pulling while intercepting the radiation in this manner, a rapid crystal growth is effectively prevented and a high reproducibility is assured. Consequently, the generation of twins or of a polycrystal is remarkably prevented while the shoulder portion of the crystal is formed.

Since a single crystal is to be grown, a temperature gradient in the direction of growth is necessary when the crystal is pulled. Assuming that the temperature gradient such as shown in FIG. 2 is provided in the direction of crystal growth, and that the temperature of the material is 1000° C. or higher, then substantially all the heat escape from the surface of the molten material is caused by radiation. Therefore, the radiant heat flux q escaping from the material can be approximated by the following equation.

$$q = \sigma(T_1^4 - T_2^4)\frac{1}{(1/\epsilon_1) + (1/\epsilon_2) - 1},$$

where $T_1$ is the temperature of the molten material, $T_2$ is the temperature of an object above the material.
$\epsilon_1$ is the emissivity of the material, $\epsilon_2$ is the emissivity of an object above the material; and
$\sigma$ is the Stefan-Boltzmann constant.

From the above equation, it is understood that q becomes smaller as the difference between $T_1$ and $T_2$ becomes smaller. It is further understood from FIG. 2 that $T_m - T_b > T_m - T_a$, and therefore the amount of heat radiation from the surface of the raw material molten solution upwardly becomes smaller when a heat insulating plate is provided at the position denoted by A, as compared with the position B. From the above analysis, it is clear how important it is that the interception of the heat radiation takes place as close as possible to the surface of the raw material molten solution. By intercepting the radiation very close to the raw material molten solution surface in accordance with the present invention, the effect of maintaining the required temperature of the surface of the raw material molten solution can be significantly improved.

After the formation of the shoulder portion the first member is elevated together with the crystal pulling shaft placed on the shoulder portion of the crystal. The opening of the first member does not have to be so large as to pass the pulled crystal therethrough. Rather, an opening large enough to pass the seed crystal is sufficient. Therefore, the amount of radiation through the opening of the first member can be minimized.

In addition, by using the third member, the heat radiation escaping through the first member can be intercepted by the third member. By moving the second member together with the pulling shaft through the opening of the third member therebelow, the second member can be covered by the third member. Therefore, the heat radiation escaping through the second member can be intercepted by the third member. Interception of radiation by these three members is especially effective when the temperature above these members is low.

Further, by radiating heat back to the surface of the raw material molten solution and into the space just above the solution, during the first radiation interception until the shoulder formation of the crystal is completed, cooling of the raw material molten solution can be suppressed even more. By this return heat radiation a rapid growth of the crystal during forming the shoulder is prevented.

As described above, by suppressing the emission of heat from the space above the surface of the raw material molten solution, a rapid growth while forming the shoulder portion is suppressed and the generation of a polycrystal or of twins is significantly suppressed, when a crystal having a low thermal conductivity or a crystal with a small temperature gradation in the pulling direction, is to be formed.

The coracle dipped in the raw material molten solution in the present invention keeps constant the diameter of the surface of the raw material molten solution from which the crystal is being pulled. This is so because the amount of raw material molten solution necessary for pulling is appropriately controlled by introducing the raw material molten solution into the coracle. With the help of the coracle, the shoulder portion of the crystal can be surely formed with a smooth shape, and the diameter of the cylindrical body portion of the crystal being pulled can be controlled.

The foregoing and other objects, features, aspects and advantages of the present invention will become more apparent from the following detailed description of the present invention when taken in conjunction with the accompanying drawings

DESCRIPTION OF THE PREFERRED EMBODIMENTS

The first embodiment of the present invention will now be described in the following.

Figure 1A:
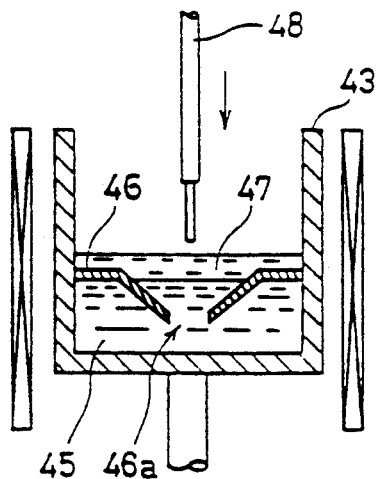
FIGS. 1A, 1B and 1C show schematic diagrams of a conventional apparatus for manufacturing a single crystal.
Figure 1B:
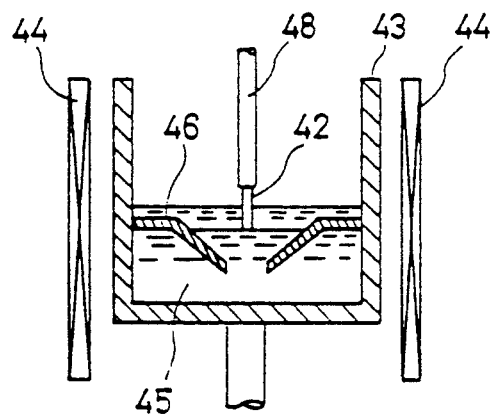
Figure 1C:
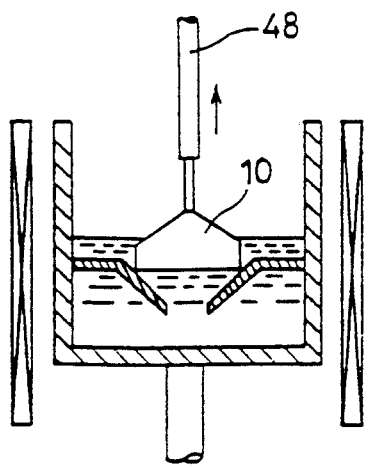
Figure 2:
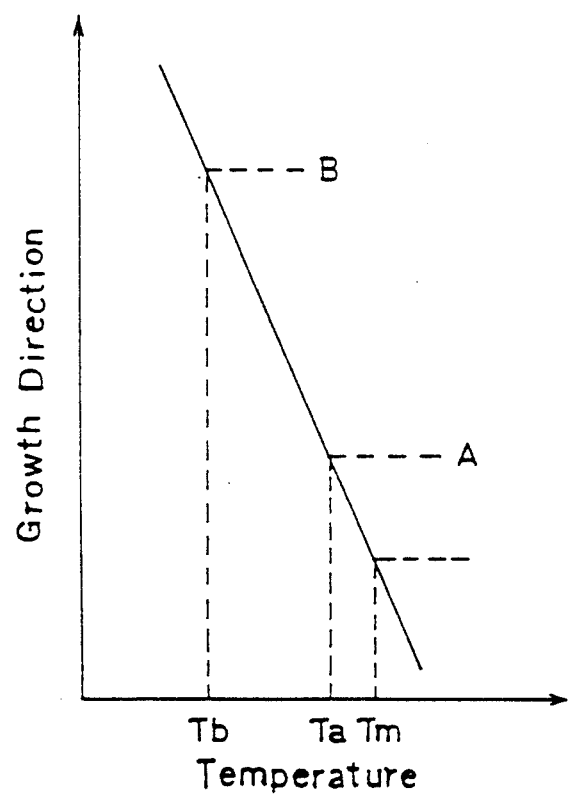
FIG. 2 is a graph depicting the effect of bringing the first radiation intercepting member near the surface of the raw material molten solution in the method and apparatus in accordance with the present invention.
Figure 3:
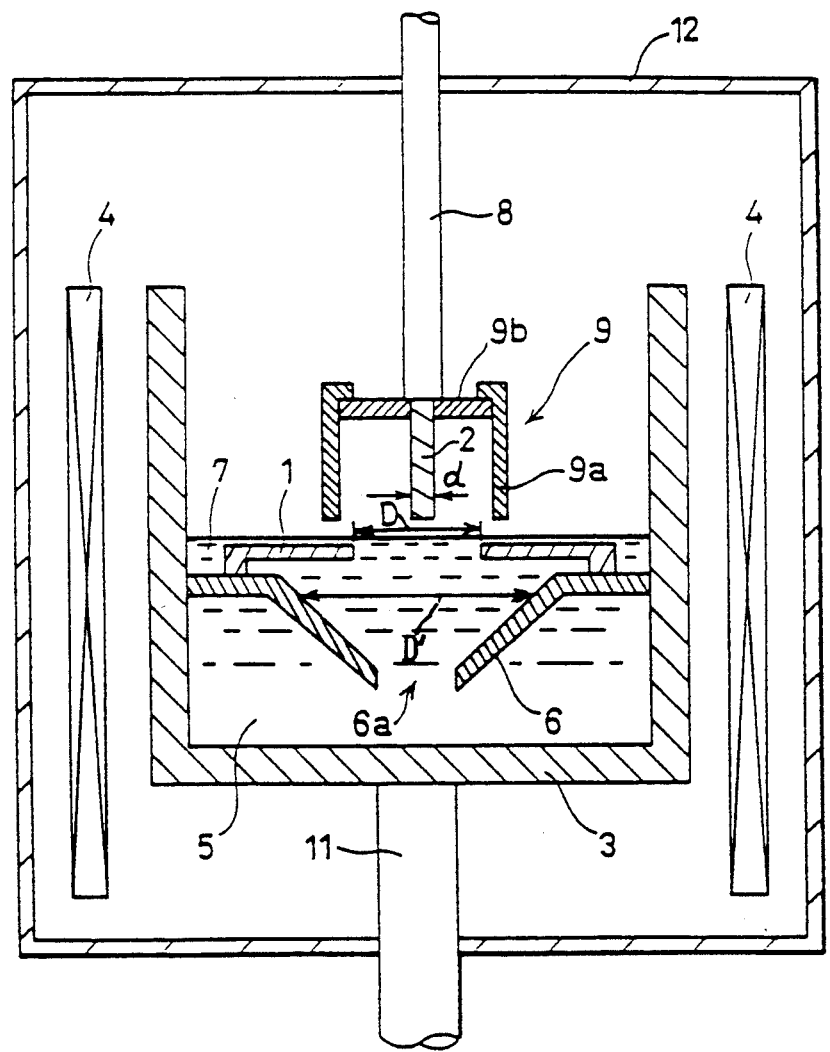
FIG. 3 is a schematic diagram of the apparatus for manufacturing a single crystal used in the first embodiment.
Figure 4A:
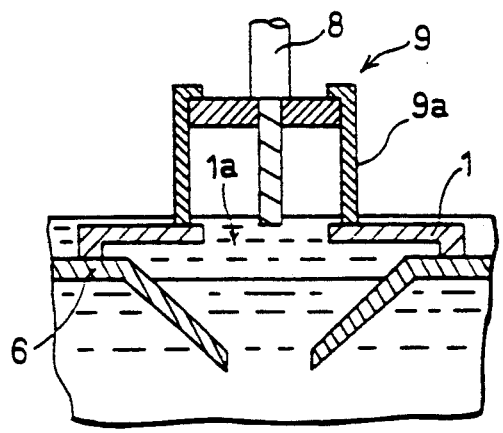
FIGS. 4A to 4D are schematic diagrams showing the manner of pulling a single crystal from the molten material beginning with the seeding, by using the apparatus shown in FIG. 3.
Figure 4C:
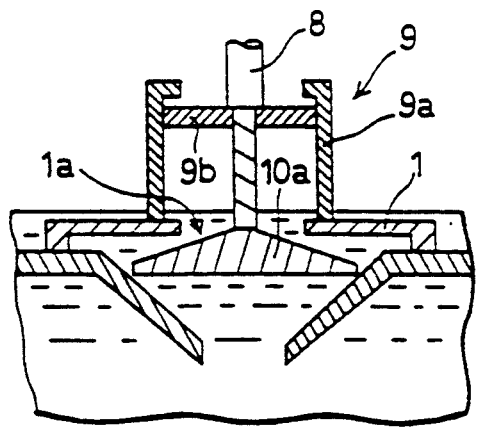
Figure 4B:
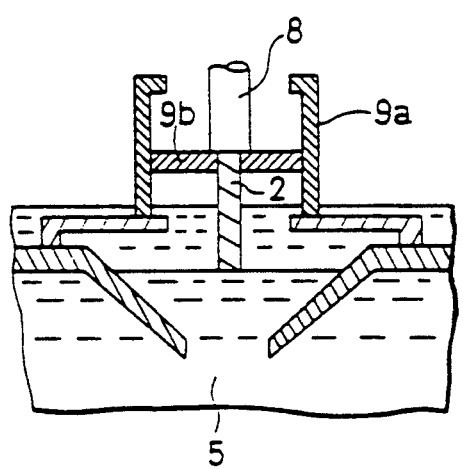
Figure 4D:
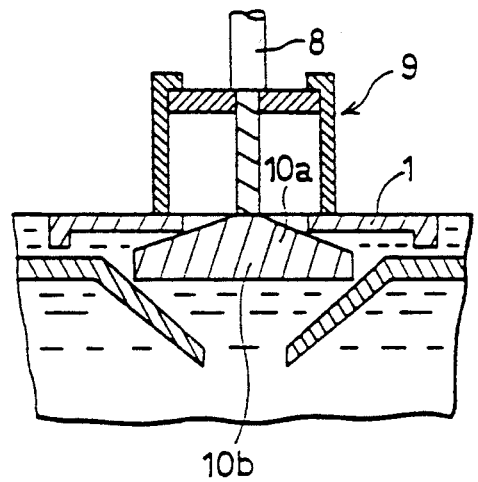
Figure 5:
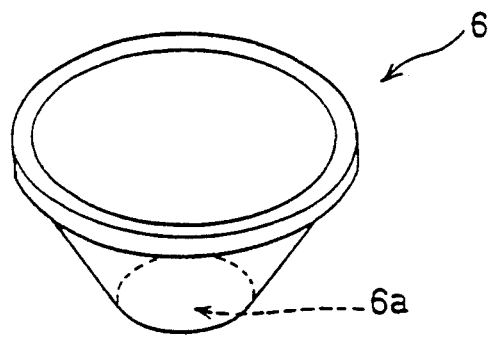
FIG. 5 is a perspective view showing the shape of the coracle used in the apparatus of FIG. 3.
Figure 6:
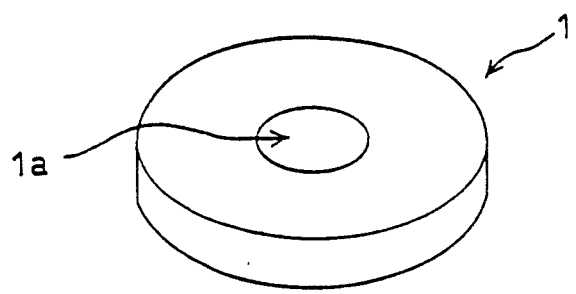
FIG. 6 is a perspective view showing the first radiation intercepting member used in the apparatus of FIG. 3.
Figure 7:
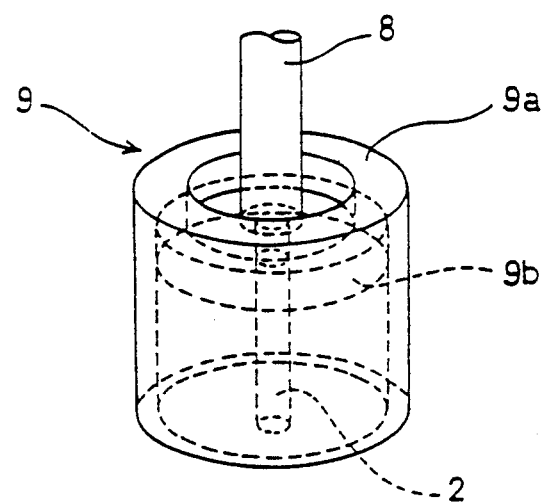
FIG. 7 is a perspective view showing the second radiation intercepting member used in the apparatus of FIG. 3.

Referring to FIGS. 3 and 4, in this apparatus, a crucible 3 containing a raw material molten melt 5 is rotatably supported by a lower shaft 11 in a chamber 12. A heater 4 is arranged around the crucible 3. A coracle 6 floats on the raw material molten melt 5. Coracle 6 has a communicating hole 6a at the bottom portion, and the raw material molten melt 5 is introduced therein. A ring-shaped first radiation intercepting member, hereinafter simply referred to as the first member, is mounted on coracle 6 to keep the temperature of the raw material molten melt 5 in coracle 6. FIGS. 5 and 6 show coracle 6 and the first member 1, respectively. Coracle 6 is an inverted conical molded body having a communication hole 6a at the bottom. The first member is a disk-shaped molded body having an opening 1a at the center. The surface of raw material molten melt 5 is covered with a liquid encapsulant 7. A rotatable and vertically movable upper shaft 8 for pulling the crystal is positioned above the central portion of the crucible 3. In the apparatus structured as described above, a seed crystal 2 and a second radiation intercepting member, hereinafter simply referred to as the second member 9, are attached to the lower end of upper shaft 8. The second member 9 has a disk-shaped radiation intercepting plate 9b and a cylindrical radiation intercepting cylinder 9a, whereby the plate 9b is movable in the cylinder 9a, in the manner of a piston as shown in FIGS. 3, 4A, 4B, 4C, 4D, and 7. The lower end of the upper shaft 8 and the seed crystal 2 are attached at the central portion of radiation intercepting plate 9b.

In the present apparatus for manufacturing a single crystal, the gap $(D-d)/2$ provided when the seed crystal 2 is passed through the opening may be 2 to 20 mm and preferably in the range of 4 to 10 mm where D represents the diameter of the opening of the first member 1 and d represents the diameter of the seed crystal. With the gap within such range, the seed crystal can be smoothly passed through the opening, while heat radiation from the opening is minimized.

The steps of forming a single crystal by using the above described apparatus will now be described. Raw material molten melt 5 and liquid encapsulant 7 are contained in crucible 3, and the temperature of the raw material molten melt is controlled by means of heater 4. With the coracle 6 dipped in raw material molten melt 5, the first member 1 is placed on coracle 6. At this time, coracle 6 and the first member 1 resting on the coracle 6 float on the raw material molten melt 5, since the coracle is constructed to have an appropriate buoyancy. The floating coracle 6 is filled with the melt, and the surface of the molten solution has an appropriate diameter D'. When upper shaft 8 is lowered to lower the seed crystal 2 and the second member 9 as shown in FIG. 4A, the radiation intercepting cylinder 9a of the second member 9 is first placed on the first member 1. In this state, the opening 1a of the first member is covered by the second member 9, whereby heat radiation from the melt through the opening 1a in coracle 6 is intercepted. When the upper shaft 8 is further lowered with the radiation intercepted, the radiation intercepting plate 9b slides in the radiation intercepting cylinder 9a and moves downwardly in the second member 9, and the seed crystal 2 is dipped into the melt 5 as shown in FIG. 4B, whereby seeding begins. After seeding, upper shaft 8 is lifted while it is rotated, and a shoulder portion 10a of the single crystal is formed as shown in FIG. 4C. From the seeding to the formation of the shoulder portion, the second member 9 is kept placed on the first member 1 as shown in FIG. 4D. In addition, radiation intercepting plate 9b slides in the radiation intercepting cylinder 9a, and therefore the opening 1a of the first member 1 is kept covered by the second member 9. Thus, seeding takes place while heat escaping by radiation from the opening 1a is sufficiently suppressed, and then the single crystal is pulled. When upper shaft 8 is further elevated, the first member 1 is positioned on the shoulder portion 10a of the single crystal being formed, and the second member 9 is still positioned on the first member, in which state the cylindrical body portion 10b of the single crystal is formed. In this manner, seeding and formation of the shoulder portion are carried out with the entire surface of the melt 5 covered by the first and second members, whereby the single crystal is being formed with a high reproducibility, and the formation of a polycrystal and twins is prevented. The rapid growth of the crystal after seeding is also prevented.

A GaAs single crystal was grown with the temperature gradient in the direction of pulling being as small as 5° to 10° C./cm by using the apparatus shown in FIG. 3. The apparatus was so constructed that the crucible 3 was made of PBN having a diameter of 4 inches, the coracle 6 was made of BN with a thickness of 10 mm, and the diameter D' of the melt in the coracle 6 was 55 mm. The first member 1 had a disk-shape with a hole at the center, the inner diameter of which is little larger than the diameter of the opening of coracle 6, and the member 1 was made of carbon having a thickness of 5 mm. The diameter of the opening of the first member 1 was 10 mm. The second member 9 was made of carbon having a thickness of 5 mm, the diameter of radiation intercepting plate 9b was 90 mm, the diameter of the upper opening of the radiation intercepting cylinder 9a was 15 mm and the length of cylinder 9a was 40 mm. 1.5 kg of GaAs polycrystal and 200 g of liquid encapsulant $B_2O_3$ were charged into the crucible 3. A chamber 12 was pressurized to 10 kg/cm$^2$ with Ar gas. A seed crystal 2 of GaAs <10022 4 mm square and 39 mm in length was attached at the lower end of upper shaft 8 through radiation intercepting plate 9b. The raw material polycrystal was heated and molted by heater 4. The upper shaft 8 was lowered so that the seed crystal 2 dipped into the raw material molten melt 5, then the temperature of the raw material molten solution was adjusted to the temperature of crystal growth, and the single crystal was grown with a pulling speed of the upper shaft 8 of 5 mm/h. The rate of rotation of upper shaft 8 was 5 rpm and the rate of rotation of lower shaft 11 was 10 rpm. Consequently, a GaAs single crystal having a cone angle at the shoulder portion of 90° C., a diameter of the cylindrical body of 55 mm and a length of 100 mm was obtained. The dislocation density of the resulting single crystal was as low as 1000 cm$^{-2}$ to 1500 cm$^{-2}$, and it was found that the crystal quality was superior with hardly any crystal defects. The single crystal could be pulled with a yield of 90%.

On the other hand, a crystal was grown with only the outer periphery of the raw material molten melt being kept warm by using the first member 1 only, under the same conditions as in the above described case, whereby a rapid growth of the crystal occurred frequently immediately after the seeding until the diameter became as large as 10 mm, and twins were frequently formed immediately below the seed crystal As a result, the yield of pulling the single crystal was lowered to 50%. From these results, it is shown that the method and an apparatus for manufacturing a single crystal in accordance with the present invention has been significantly improved for a better production yield of the single crystal as compared with the prior art.

Figure 8:
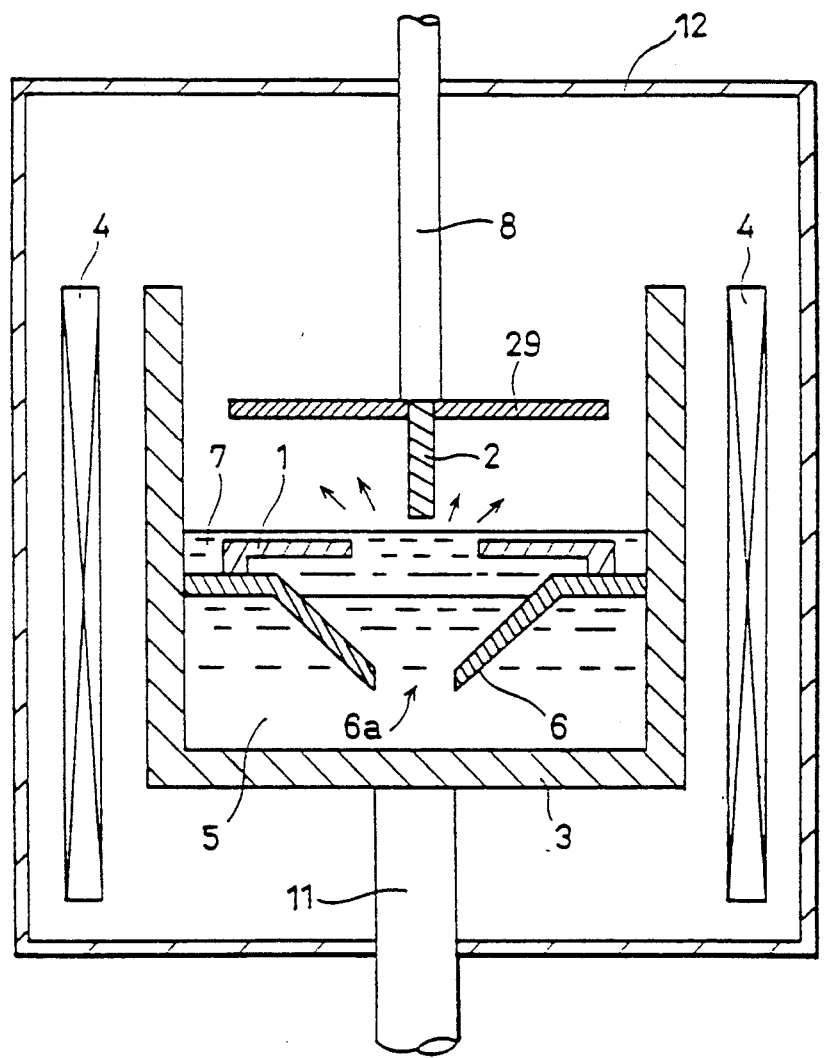
FIG. 8 is a schematic diagram showing the apparatus for manufacturing a single crystal in accordance with a second embodiment.

A member which covers the first member and is capable of sufficiently suppressing heat radiation may be used as the second member described in the above embodiment. For example, out of the second member described in this embodiment, only the radiation intercepting plate may be used as the second member provided that the diameter of such a plate is large enough. An example using only such a radiation intercepting plate 29 is shown in FIG. 8 as a second embodiment. The disk-shaped radiation intercepting plate 29 has a diameter large enough to intercept heat radiation shown by arrows through the opening of the first radiation intercepting member 1. In this apparatus, portions other than the radiation intercepting plate 29 are the same as those in the first embodiment.

Figure 9:
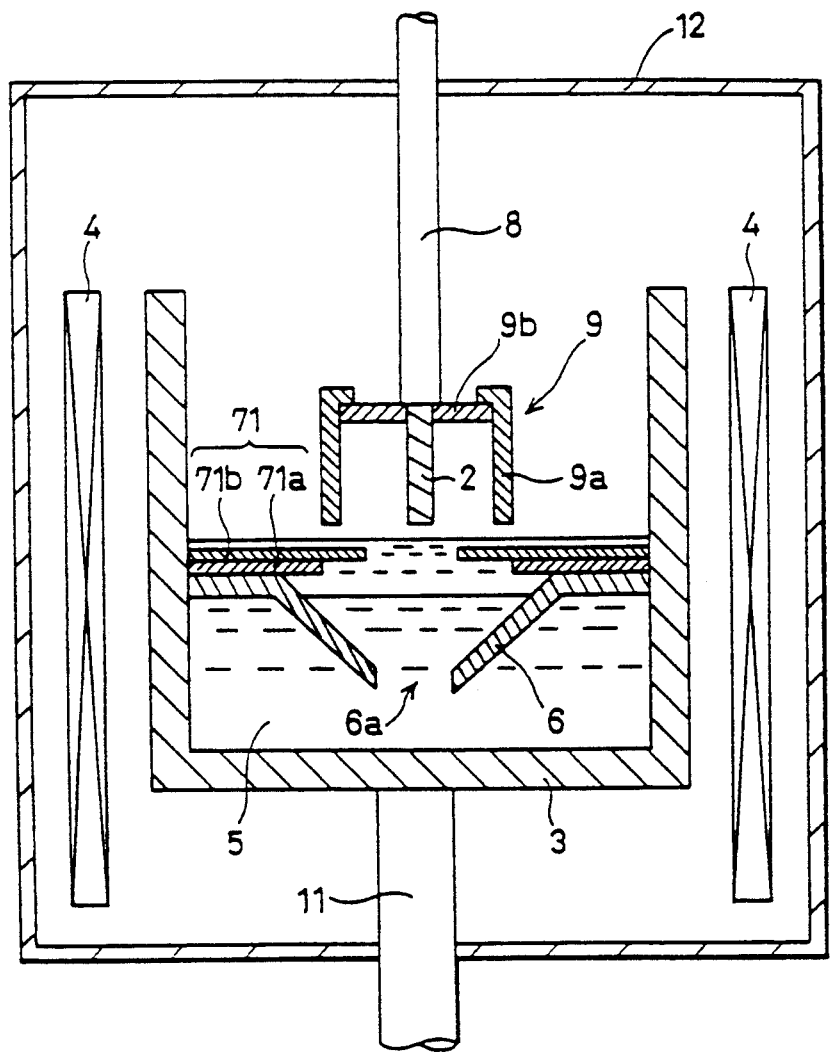
FIG. 9 is a schematic diagram showing an apparatus for manufacturing a single crystal in accordance with a third embodiment.
Figure 10:
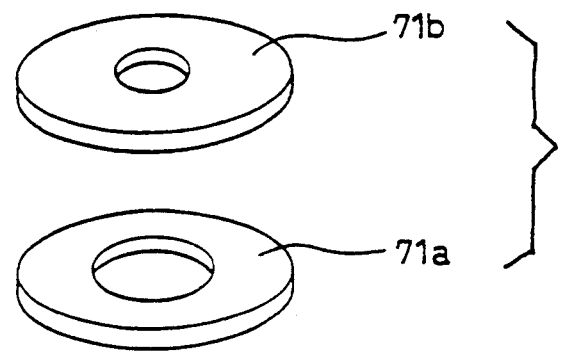
FIG. 10 is a perspective view showing the first radiation intercepting member used in the apparatus of FIG. 9.
Figure 11:
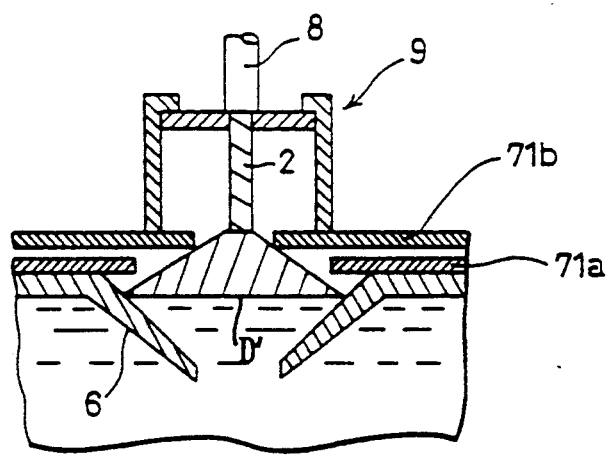
FIG. 11 is a schematic diagram showing the manner of forming the shoulder portion of the crystal in the apparatus shown in FIG. 9.

Various structures other than those described above may be employed as the radiation intercepting member of the present invention. A modification of the first radiation intercepting member is shown in FIG. 9 as a third embodiment. In this third apparatus, the first radiation intercepting member 71 includes two diskshaped members 71a and 71b having openings of different diameters. FIG. 10 is a perspective view of these members 71a and 71b. In this apparatus, disk-shaped member 71a having a larger diameter opening is mounted on the coracle 6, and disk-shaped member 71b having a smaller diameter opening is mounted thereon When the members of such a structure are used, first the disk-shaped member 71b is pulled when the shoulder portion of the crystal is formed, as shown in FIG. 11. At this time, the lower diskshaped member 71a stays on the coaracle 6, whereby escape of heat because of radiation from the surface of the melt which has not yet been crystallized is effectively prevented. Thus, a rapid growth of the shoulder portion is effectively prevented. Although two disk-shaped members were used in the above embodiment, the first radiation intercepting member may include three or more disk-shaped members.

Figure 12:
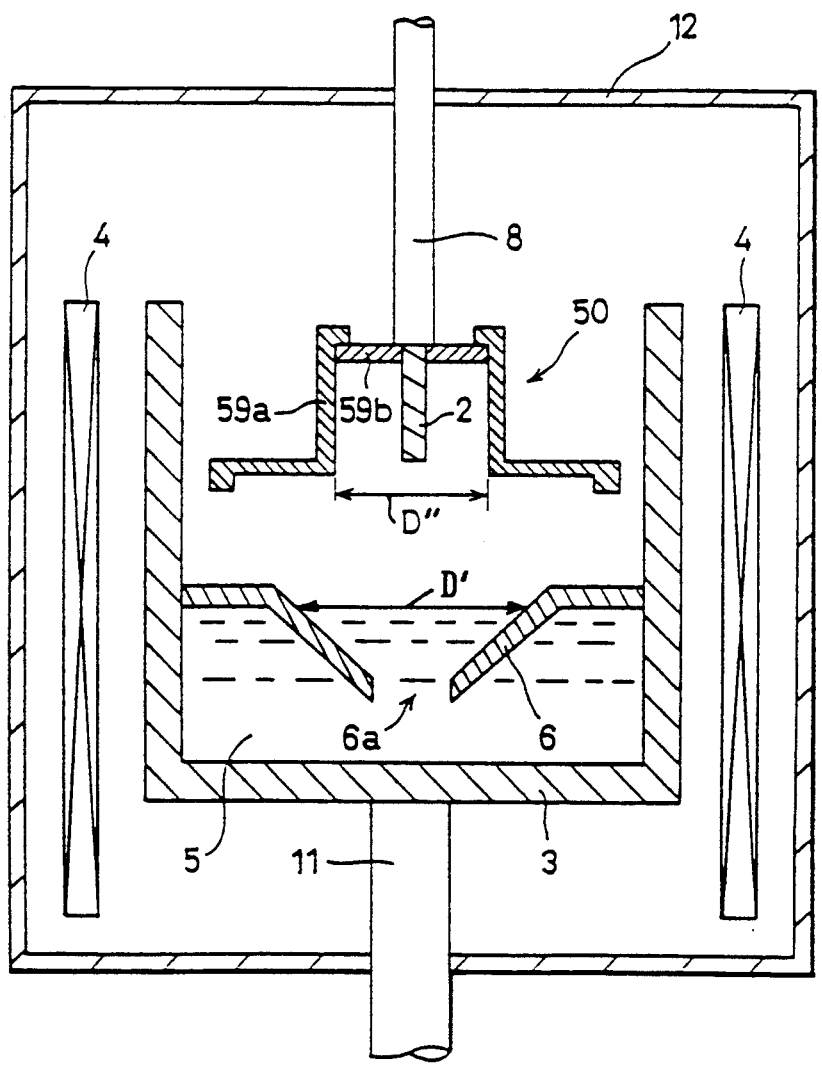
FIG. 12 is a schematic diagram of an apparatus for manufacturing a single crystal used in a fourth embodiment of the present invention.

A radiation intercepting device 50 having a structure in which the first radiation intercepting member and the second radiation intercepting member shown in the first embodiment, are integrated, is shown in FIG. 12 as a fourth embodiment. The radiation intercepting member 50 is placed on the coracle 6 when the upper shaft 8 is lowered. Then, when the upper shaft 8 is further lowered, a radiation intercepting plate 59b slides in radiation intercepting cylinder 59a as in the first embodiment. After the seeding has been carried out in the same manner as in the first embodiment, the shoulder portion of the crystal is pulled. Radiation intercepting member 50 is pulled up together with the growing crystal. The inner diameter D" of member 50 should be as small as possible, since radiation from the surface of the melt can be more effectively intercepted when the inner diameter D" is smaller.

Figure 13:
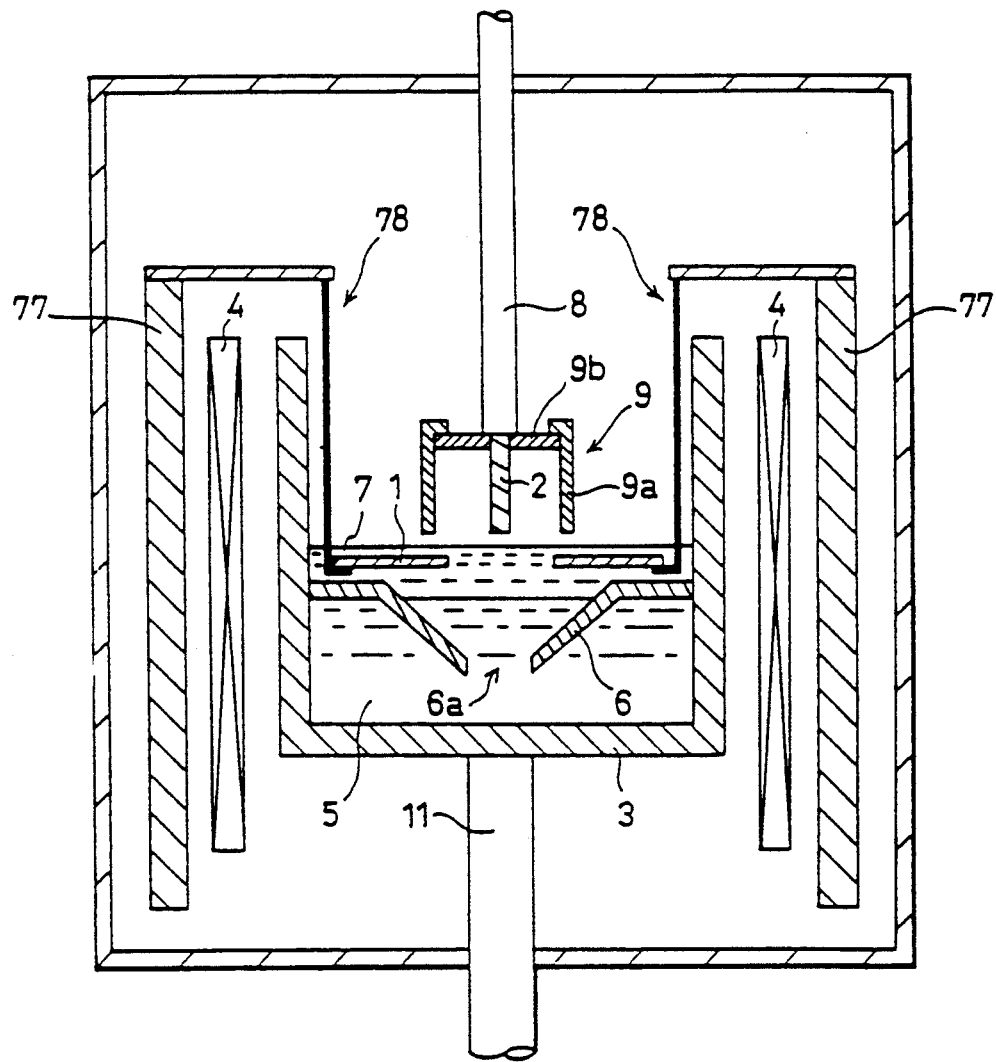
FIG. 13 is a schematic diagram showing an apparatus in which the first member is supported by a supporter.

In the above described embodiments, the first radiation intercepting member 1 was placed on the coracle However, the first member 1 may be supported by other members. In the example shown in FIG. 13, the first member 1 is supported by a supporter 78 attached to a heat insulator 77, whereby the first member is held slightly above the coracle 6.

Figure 14:
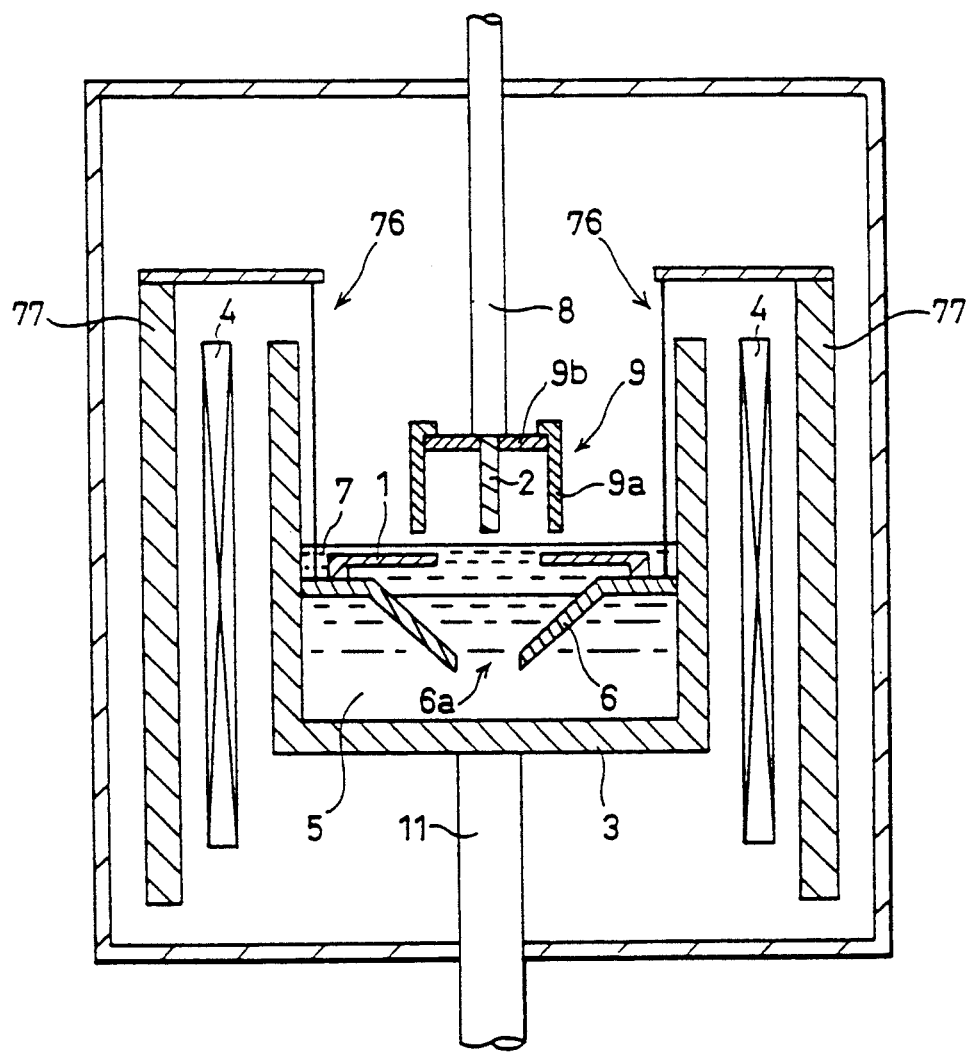
FIG. 14 is a schematic diagram of the apparatus used in the fifth embodiment.
Figure 15A:
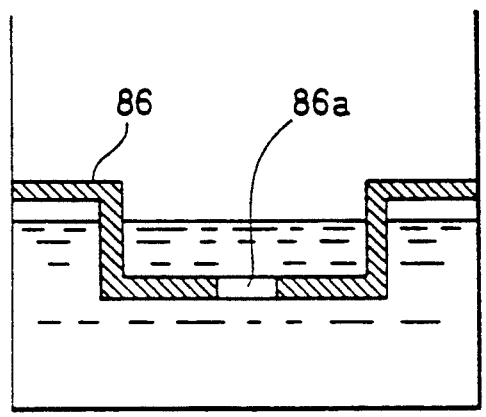
FIGS. 15A and 15B are cross-sections showing other examples of the coracle used in the present invention.
Figure 15B:
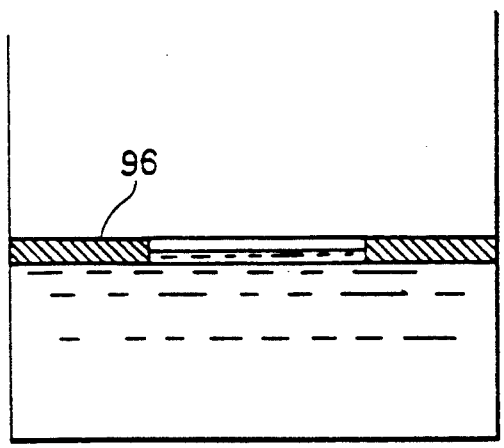

Although the coracle is not fixed but floating on the raw material molten solution in the crucible in the above embodiments, the coracle may be fixed on other members. FIG. 14 shows a fifth apparatus embodiment wherein the coracle is fixed by a coracle supporter 76 on a heat insulator 77 surrounding the heater and crucible. In this apparatus the parts other than the mechanism for fixing the coracle, are the same as those of the first embodiment. In this apparatus, the lower shaft 11 is rotatable and vertically movable. The diameter D' of the surface of the melt 5 in the coracle 6 is adjusted by moving the lower shaft up or down. Although the coracle is fixed to the heat insulator in this apparatus, it may be fixed to other members, or it may be fixed to another member which is vertically movable. Any coracle having a structure capable of maintaining the surface of the melt 5 contained therein at a prescribed diameter D' may be used, and a coracle such as shown in FIG. 15A or FIG. 15B may be used in place of the coracle 6 described above. The coracle 86 shown in FIG. 15A receives the melt through the communicating hole 86a and keeps the melt in a cylindrical shape. The coracle 96 of FIG. 15B is a ring-shaped disk. Further, if the crystal is to be grown without rotation, a coracle may be used, wherein a cross-section of a recess holding a melt portion in the coracle is polygonal or elliptical.

Although the surface of the raw material molten solution was covered with a liquid encapsulant in the above described embodiments, a liquid encapsulant may not be needed dependent on the material of the crystal or the method of growth.

Figure 16:
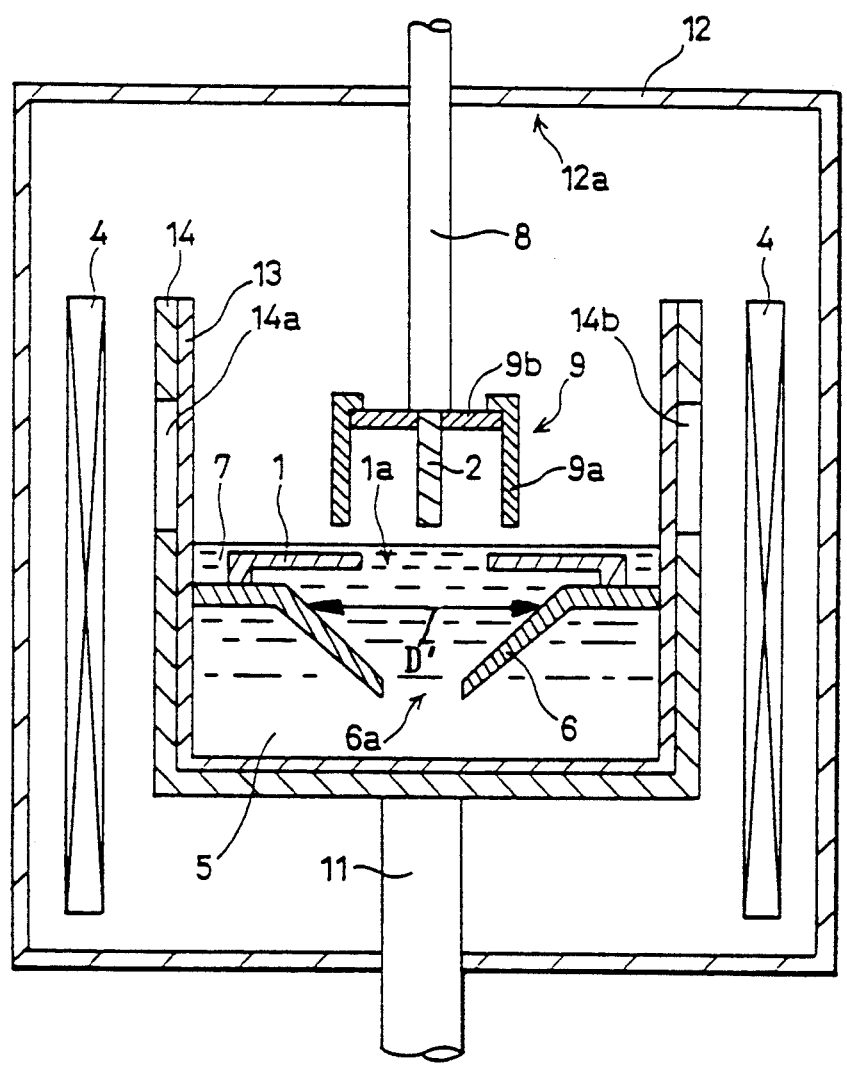
FIG. 16 is a schematic diagram of an apparatus for manufacturing a single crystal used in a sixth embodiment.

A sixth embodiment in accordance with the present invention will now be described. FIG. 16 schematically shows an apparatus for manufacturing a single crystal used in the sixth embodiment. In this apparatus, a crucible 14 is supported by a rotatable lower shaft 11 in a chamber 12. A quartz crucible 13 for containing the raw material molten melt 5 is provided in the crucible 14. In the quartz crucible 13, a coracle 6 is floating on the raw material molten melt 5. The coracle 6 has a communication hole 6a in the bottom and the melt 5 passes through the hole 6a. Portions above the surface level of the raw material molten melt 5 of crucible 14 are removed to provide a pair of windows 14a and 14b, through which quartz crucible 13 can be seen. A ring-shaped first radiation intercepting member 1 is placed on coracle 6 so as to maintain the temperature of the raw material molten solution in coracle 6. The shapes of the coracle and of the first member 1 are as shown in FIGS. 5 and 6. A rotatable and vertically movable upper shaft 8 is provided above the central portion of the crucible 13. The surface of raw material molten melt 5 is covered with liquid encapsulant 7. A seed crystal 2 as well as a second radiation intercepting member 9 are attached to the lower end of upper shaft 8. The second member 9 has a structure including a disk-shaped radiation intercepting plate 9b movable like a piston in a cylindrical radiation intercepting cylinder 9a. Upper shaft 8 and seed crystal 2 are attached at the central portion of the radiation intercepting plate 9b.

The steps for forming a single crystal by using such a device will be described as follows. Raw material molten melt 5 and liquid encapsulant 7 are contained in crucible 13, and the temperature is controlled by means of a heater 4. While the coracle 6 is dipped into the melt 5, the first member 1 is placed on coracle 6. At this time, coracle 6 together with the first member 1 float on melt 5 due to an appropriate buoyancy of the coracle 6. Raw material molten solution enters into floating coracle 6 and the surface of the melt in the coracle has an appropriate diameter D1. Through the windows 14a and 14b formed in the crucible 14, radiation from the heater 4 passes the quartz crucible 13. Therefore, the surface of the melt 5 and the space above the melt 5 are heated by this radiation. When upper shaft 8 is lowered so as to lower the seed crystal 2 and the second member 9 in this state, the radiation intercepting cylinder 9a of the second member 9 is first placed on the first member 1 as shown in FIG. 4A, in the same manner as in the first embodiment. The further operation is the same as described above with reference to FIGS. 4A to 4D.

By using the apparatus shown in FIG. 16, a GaAs single crystal was grown with the temperature gradient in the direction of pulling near the molten melt 5 as small as 5° to 10° C./cm. The temperature of the upper surface 12a of chamber 12 was as low as about 100° C. The crucible 13 was made of quartz rather than PBN as described above with reference to crucible 3. The crucible 13 had a diameter of 4 inches of quartz, and the outer crucible 14 was made of carbon.

Eight circular windows having a diameter of 30 mm were formed in wall portions of the crucible 14 above the molten solution The coracle 6 was made of BN having the thickness of 10 mm and the coracle was so constructed that the surface diameter D' of the melt contained in the coracle recess would be 55 mm. The first member 1 had a hollow disk-shape the diameter of which is little larger than the diameter of the opening 6a of coracle 6. The first member was made of carbon having the thickness of 5 mm The diameter of the hole 1a was 10 mm. The second member 9 was made of carbon having the thickness of 5 mm. The diameter of the heat insulating plate 9b was 20 mm, the diameter of the upper opening of the heat insulating cylinder 9a was 15 mm, and the length of the cylinder was 40 mm. 1.5 kg of GaAs polycrystal and 200 g of liquid encapsulant $B_2O_3$ were charged into the crucible 13, and the chamber 12 was pressurized to 10 kg/cm$^2$ with Ar gas. A seed crystal 2 of GaAs <100> which was 4 mm square and 40 mm in length was attached to the lower end of upper shaft 8 through radiation intercepting plate 9b. The raw material polycrystal was heated and molten by heater 4. The seed crystal was dipped in melt by lowering upper shaft 8, and then the temperature of the melt was adjusted to the temperature of crystal growth. A single crystal was grown with a rate of pulling the upper shaft 8 at 5 mm/hr while rotating the upper shaft 8 at 5 rpm and the lower shaft 11 at 10 rpm. Consequently, a GaAs single crystal was grown which had a cone angle of the shoulder portion 100°, a diameter of the cylindrical body portion of 55 mm and a length of 120 mm. The dislocation density of the resulting single crystal was as low as 1000 cm$^{-2}$ to 1500 cm$^2$, and it was shown to be a crystal of superior quality with hardly any crystal defect. The single crystal was pulled with a yield of 85%.

On the other hand, an experiment of crystal growth was carried out by using an apparatus in which the crucible was formed of opaque carbon and not transmitting the radiation from the heater. Since the temperature of the upper surface of the chamber was as low as about 200° C., much heat escaped because of radiation from the melt. Consequently, rapid growth of the crystal frequently occurred immediately after the seeding until the diameter became as large as 10 mm, and twins were frequently generated immediately below the seed crystal The production yield of pulling the single crystal was lowered to 60%.

Figure 17:
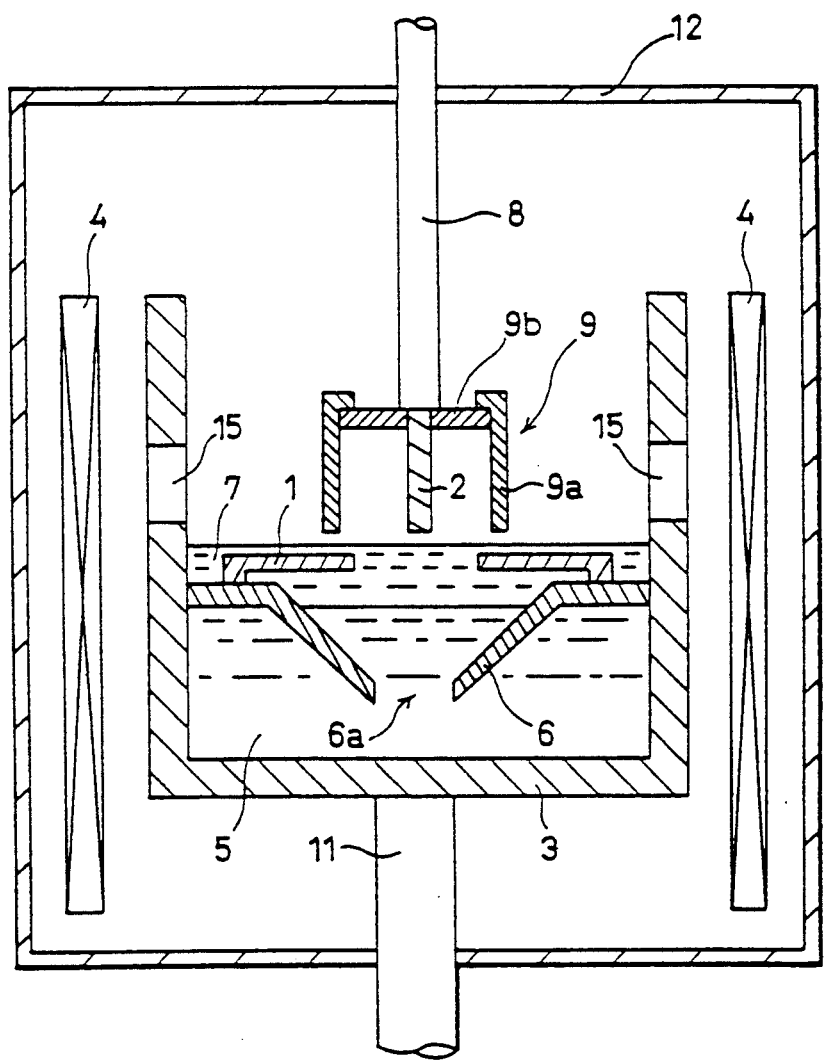
FIG. 17 is a schematic diagram of an apparatus for manufacturing a single crystal used in a seventh embodiment.

The elements for letting radiation from the heater reach the upper surface of the melt and the space above the melt may have various structures. FIG. 17 shows a respective modification of these elements as a seventh embodiment. Referring to FIG. 17, a portion of the crucible 3 which is above the surface of melt 5 and of the liquid encapsulant 7 is partially removed to provide a window 15 of appropriate size. Other structures are the same as in the apparatus of FIG. 16. In this example, the heat radiation from heater 4 is directly radiated to the surface of the melt and to the radiation intercepting member 1 through the windows 15.

The first and second radiation intercepting members 1 and 9 shown in the sixth and seventh embodiments may be modified as shown in the second, third and fourth embodiments. Further, the coracle may be fixed as shown in the fifth embodiment. Although the surface of the raw material molten melt was covered with a liquid encapsulant, the liquid encapsulant need not be used depending on the material of the crystal or on the method of growth.

Figure 18:
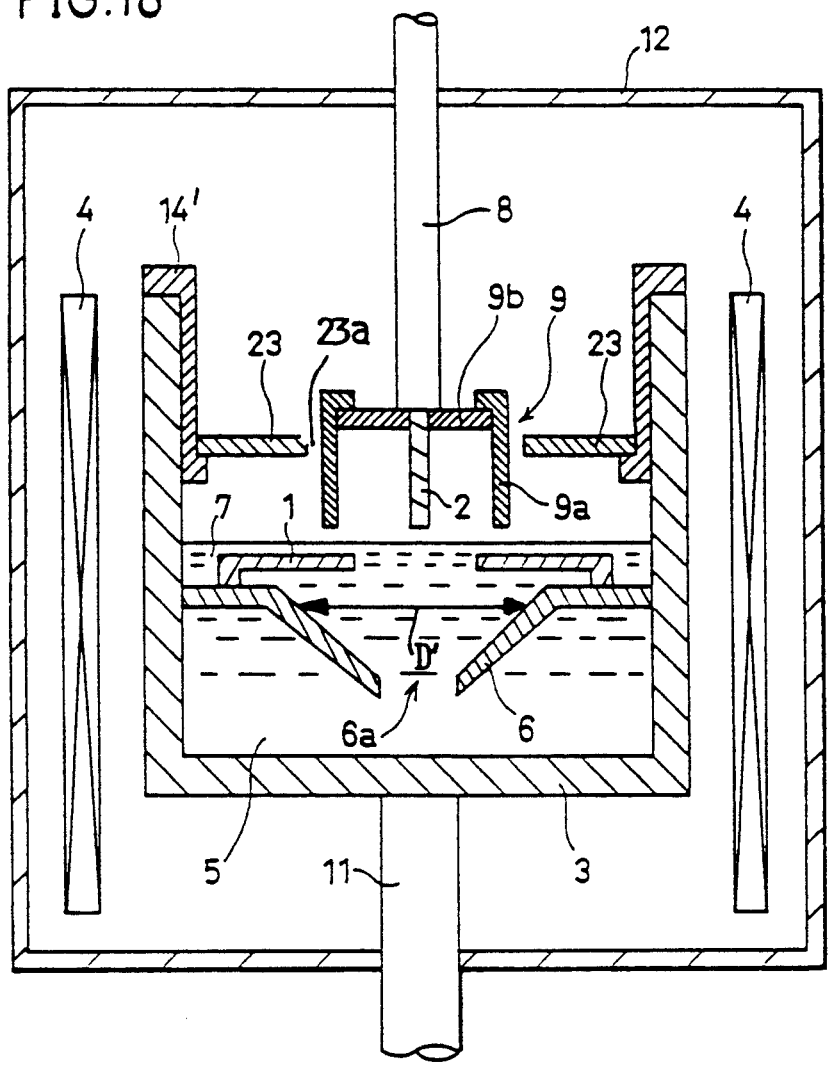
FIG. 18 is a schematic diagram of an apparatus for manufacturing a single crystal used in an eighth embodiment.
Figure 19:
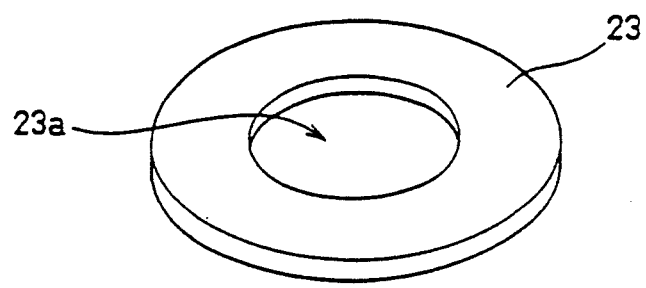
FIG. 19 is a perspective view showing the shape of the third radiation intercepting member used in the apparatus of FIG. 18.

An eighth embodiment of the present invention will now be described with reference to FIG. 18 schematically showing an apparatus for manufacturing a single crystal used in the eighth embodiment. In this apparatus, a crucible 3 containing the raw material molten solution is supported by a rotatable lower shaft in a chamber 12, and a heater 4 surrounds the crucible 3. A coracle 6 is floating on the liquid crystal molten melt 5 in crucible 3. The coracle 6 has a communicating hole 6a in the bottom portion through which the melt 5 passes into the coracle recess. A ring-shaped first radiation intercepting member 1 is mounted on the coracle 6 so as to keep the temperature of the raw material molten solution in coracle 6. The shapes of the coracle and of the first member are as shown in FIGS. 5 and 6. The surface of the melt is covered with a liquid encapsulant 7. A rotatable and vertically movable upper shaft 8 is provided above the central portion of the crucible 3. In the apparatus structured as described above, a seed crystal 2 and a second radiation intercepting member 9 are attached at the lower end of the upper shaft 8. As described above, the second member 9 has a structure including a disk-shaped radiation intercepting plate 9b movable as a piston in a cylindrical radiation intercepting cylinder 9a. At the center of the radiation intercepting plate 9b, the lower end of upper shaft 8 and the seed crystal 2 are attached. A hollow disk-shaped third radiation intercepting member 23 is held above the first member 1 by a supporter 14' extending across the upper end of the crucible 3. The third member 23 includes a circular hole 23a through which the upper shaft 8 and second member 9 are passed. The third member 23 covers the upper portion of coracle 6 as shown in FIG. 18.

Figure 20A:
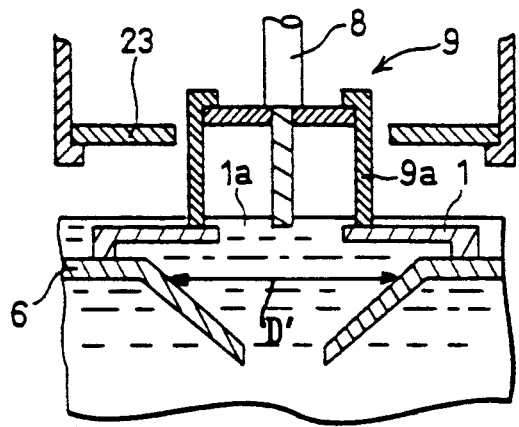
FIGS. 20A to 20E are schematic diagrams showing the manner of pulling a single crystal from the molten material starting with the seeding by using the apparatus shown in FIG. 18.
Figure 20B:
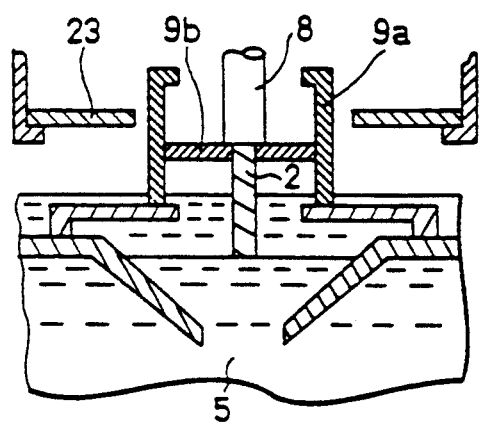
Figure 20C:
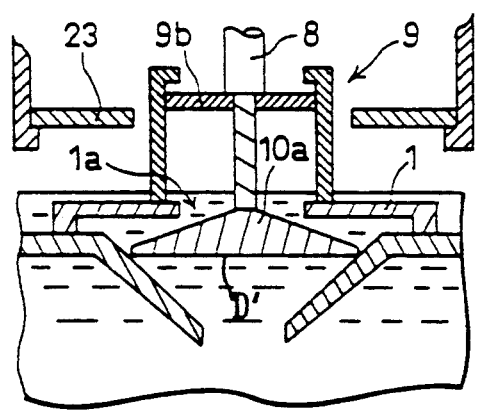
Figure 20D:
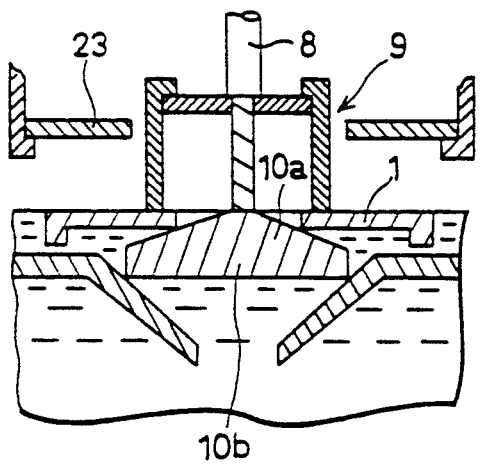
Figure 20E:
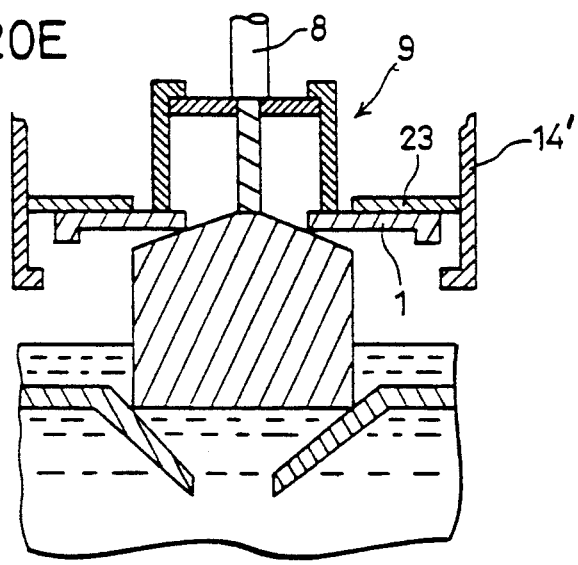

The steps of growing a single crystal by using such an apparatus will now be described. The raw material molten melt 5 and the liquid encapsulant 7 are contained in the crucible and the temperature is controlled by heater 4. While the coracle 6 is dipped in the raw material molten melt 5, the first member 1 is placed on the coracle 6. Since the coracle 6 has an appropriate buoyancy, it floats together with the first member 1 on the melt 5 and the surface area of the melt in the coracle has an appropriate diameter D'. At this state, most of the heat radiation from the melt is intercepted by the first member 1 and the third member 23. When the upper shaft 8 is lowered with the seed crystal 2 and the second member 9, the radiation intercepting cylinder 9a of the second member 9 first is placed on the first member 1 as shown in FIG. 20A, whereby the opening 1a of the first member is covered by the second member 9 and heat radiation through the opening 1a from the melt in coracle 6 is intercepted. In this manner, the surface of the melt is entirely covered by the first and second members and the space above the first member is covered by the third member. The second member 9 is moved below the third member 23 through the opening 23a. Consequently, emission of heat from the first and second members is suppressed by the third member. When upper shaft 8 is further lowered, with escape of heat by radiation suppressed, the radiation interrupting plate 9b slides downwardly in the radiation intercepting cylinder 9a in the second member 9. The seed crystal 2 is dipped in the raw material molten solution 5 as shown in FIG. 20B. After seeding, when the upper shaft 8 is elevated while it is rotated, a shoulder portion 10a is formed as shown in FIG. 20C. From the step of seeding to the step of forming the shoulder portion, the second member 9 is kept placed on the first member 1. In addition, since the radiation intercepting plate 9b slides in the radiation intercepting cylinder 9a, the opening 1a of the first member 1 is kept covered by the second member 9. Therefore, the seeding is done and the single crystal is pulled while escape of heat by radiation from the opening 1a is suppressed. When the upper shaft 8 is further elevated, the first member 1 contacts the shoulder portion 10a of the growing single crystal as shown in FIG. 20D and the second member 9 remains in contact with the first member while the cylindrical body portion 10b of the single crystal is formed. When the upper shaft 8 is further elevated, the third member 23 contacts the first member and is pulled together with the single crystal, as shown in FIG. 20E. In this manner, escape of heat by radiation through the opening 1a of the first member is suppressed by the second member, the temperature of the raw material molten solution is maintained by the first and third members, and the single crystal is pulled in this condition. Therefore, rapid growth of the crystal at the start of pulling is prevented, and hence the formation of a polycrystal and twins is prevented. Consequently, a single crystal can be grown with a high reproducibility.

Figure 21:
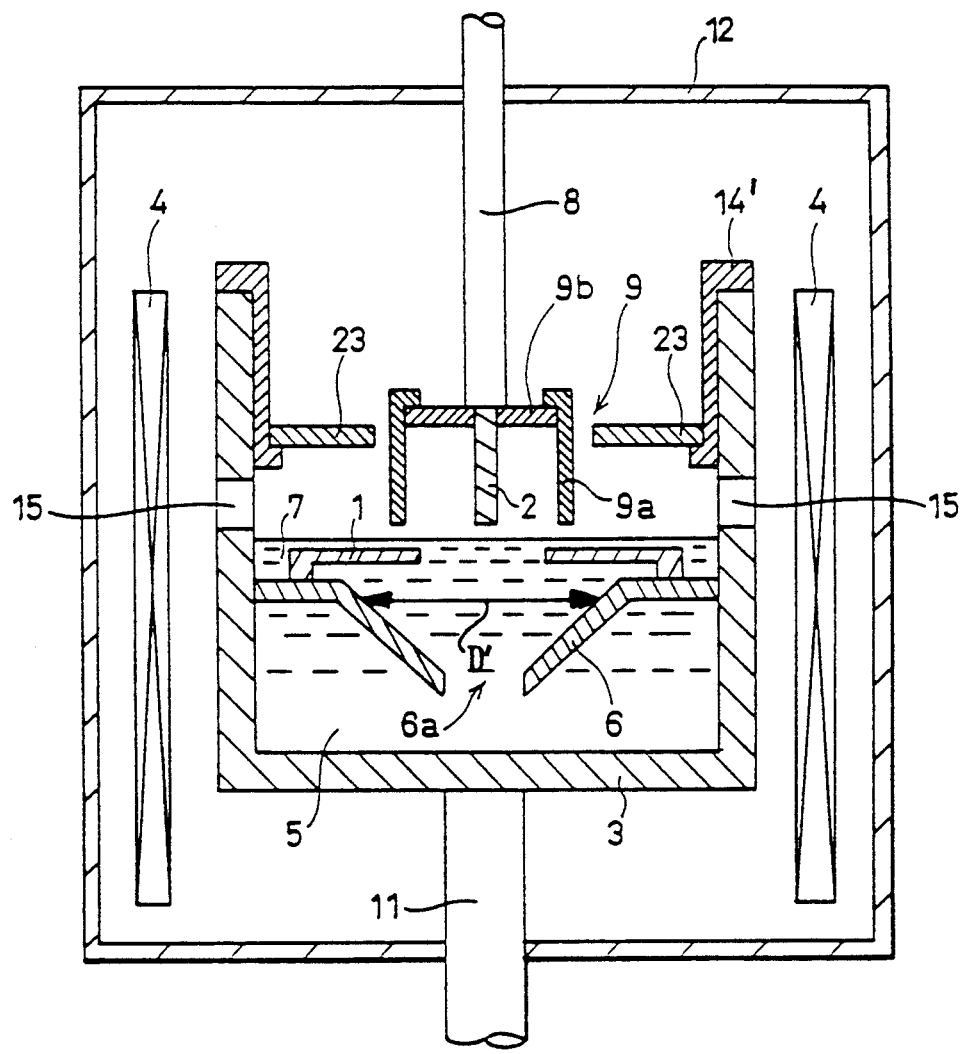
FIG. 21 is a schematic diagram of an apparatus for manufacturing a single crystal used in a ninth embodiment.

A ninth embodiment of the present invention will now be described. In the ninth embodiment, an apparatus shown in FIG. 21 was used. This apparatus differs from the apparatus of FIG. 8 in that the crucible 3 has a different structure. Windows 15 are formed in a wall portion of the crucible 3 above the surface of the liquid encapsulant 7. As described above, the window 15 may be open or an appropriate material which transmits radiation heat easily may be fitted in the opening 15. In this apparatus, in the apparatus of FIG. 18, whereby heat from the heater 4 is radiated into the crucible through the windows 15 into the space between the melt and the third member and onto the surface of the melt. This radiation heat further improves the effect of maintaining the temperature provided by the first, second and third members The steps for forming the single crystal in this apparatus are the same as those of the eighth embodiment A crystal of CdTe was formed by using the apparatus of FIG. 21. In this apparatus, the crucible was made of carbon and had a diameter of 4 inches. Quartz was fitted in the window 15. The coracle 6 was made of carbon having a thickness of 10 mm. The coracle 6 made sure that the diameter D' of the melt contained in the coracle recess was 55 mm. The first member 1 had a hollow disk-shape with a diameter a little larger than the diameter of the opening 6a of coracle 6, and the first member 1 was made of carbon having a thickness of 5 mm. The diameter of the hole was 10 mm. The second member 9 was made of carbon and had a thickness of 5 mm. The diameter of the radiation intercepting plate 9b was 15 mm. The diameter of the opening of the radiation intercepting cylinder 9a was 20 mm, and the length of cylinder 9a was 40 mm. The third member 23 was made of carbon having a thickness of 5 mm. The diameter of the opening was about 30 mm. 1.5 kg of CdTe polycrystal and 200 g of liquid encapsulant $B_2O_3$ were charged into the crucible 3. The chamber 12 was pressurized to 20 $kg/cm^2$ with Ar gas. A seed crystal 2 of CdTe (100) 4 mm square and 30 mm in length was attached to the lower end of the upper shaft 8 through the radiation intercepting plate 9b. The raw material polycrystal was heated and melted by heater 4. The upper shaft 8 was lowered to dip the seed crystal 2 into the melt and thereafter the temperature of the melt adjusted to the temperature of the crystal growth. A single crystal was grown with a rate of pulling of the upper shaft 8 at 2 mm/h while rotating rotating the upper shaft 8 at 5 rpm and the lower shaft 11 at 5 rpm. Consequently, a CdTe single crystal having a cone angle at the shoulder portion of 150°, a diameter of the cylindrical body of 55 mm, and a length of 80 mm was grown. The dislocation density of the resulting single crystal was as low as 5000 $cm^{-2}$ to 50000 $cm^{-2}$, and the crystal had a superior crystal quality. The single crystal could be pulled at the yield of 75%.

On the other hand, a crystal was grown with the temperature of the melt maintained only by the first member 1 and other conditions being the same as described above. Consequently, a rapid growth of crystal tended to occur immediately after the seeding until the diameter became 20 mm, and twins were frequently generated immediately below the seed crystal. The yield of pulling the single crystal was lowered to 5%.

The first and second radiation intercepting members described in the eighth and ninth embodiments may be modified as shown in the second, the third and the fourth embodiments. The coracle may be fixed as described in the fifth embodiment. Although the surface of the raw material molten solution was covered with a liquid encapsulant in the above described embodiments, the liquid encapsulant may not be used dependent on the material to be grown or dependent on the method of growth.

Figure 22:
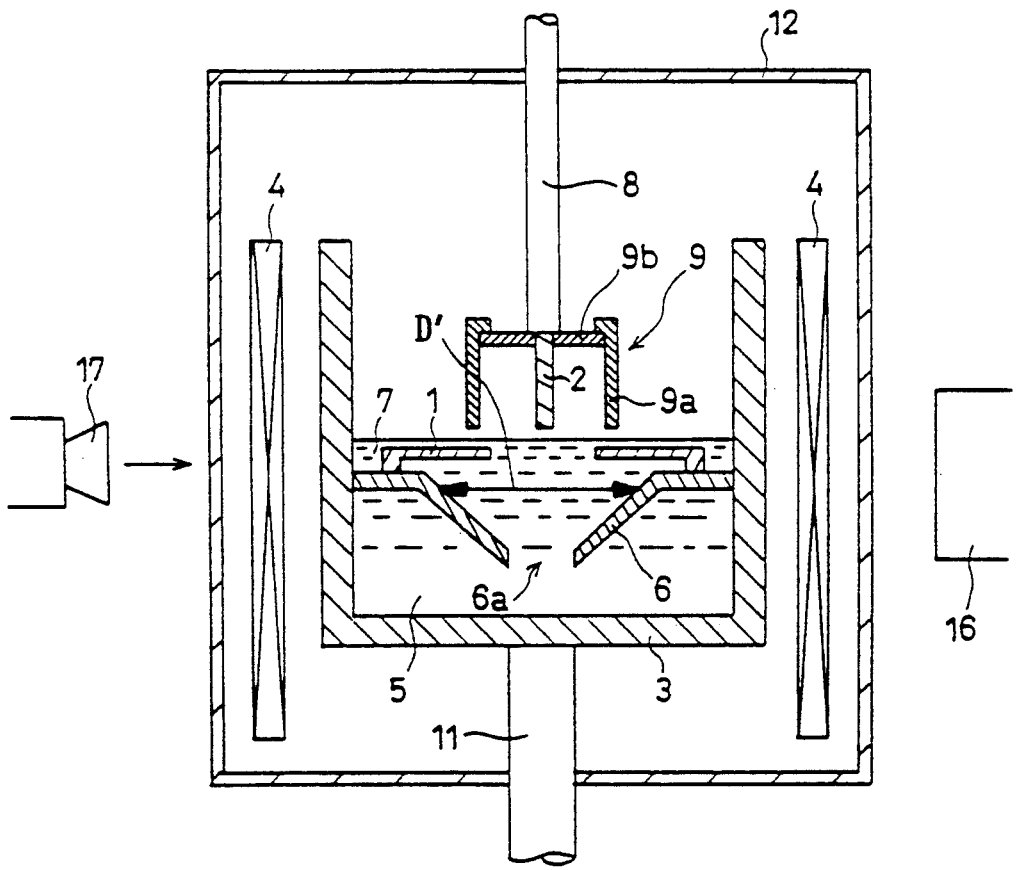
FIG. 22 is a schematic diagram of an apparatus for manufacturing a single crystal used in a tenth embodiment.

A tenth embodiment in accordance with the present invention will now be described. FIG. 22 is a schematic diagram of the apparatus used in the tenth embodiment The apparatus includes a device for obtaining an X-ray image in addition to the apparatus of the first embodiment. More specifically, an X-ray tube 17 for generating X-rays and an X-ray imaging system 16 for forming an image by detecting the X-rays are provided outside the chamber 12. The outlet of the X-ray tube 17 is directed onto the crucible 3 in the chamber 12. The portion for detecting the X-rays (not shown) of the X-ray imaging system is positioned opposite the outlet of the X-ray tube 17 on the other side of the crucible 3. The X-rays emitted by the X-ray tube 17 enter the chamber 12, pass through the crucible 3 and reach the X-ray imaging system 16 for X-raying the crucible In this apparatus, portions other than the X-ray tube 17 and the X-ray imaging system 16 are substantially the same in structure as the apparatus of the first embodiment.

A CdTe single crystal was grown by using the apparatus shown in FIG. 22. The crucible 3 was made of quartz coated with carbon, and its diameter was 4 inches. The coracle 6 was made of carbon having a thickness of 10 mm, and it was so constructed that the diameter D' of the melt contained therein was 52 mm. The coracle 6 had an appropriate specific gravity so that it floated on the melt. The first member 1 had a hollow disk-shape the diameter of which was a little larger than the diameter of the opening of coracle 6. The member 1 was made of carbon to have a thickness of 5 mm, and a diameter of the opening was 20 mm. The second member 9 including the radiation intercepting cylinder 9a and the radiation intercepting plate 9b was made of carbon. The thickness of the radiation interrupting cylinder 9a was 5 mm, the diameter was 30 mm and the length was 50 mm. The thickness of the radiation intercepting plate 9b was 5 mm. A CdTe single crystal cut in the direction of (111) having a dimension of 4 mm square and 30 mm in length was used as the seed crystal 2. 1.0 kg of CdTe polycrystal and 100 g of liquid encapsulant $B_2O_3$ were charged into the crucible 3. The chamber 12 was filled with Ar gas so that the pressure was 15 kg/cm$^2$. The material polycrystal was heated and molten by heater 4, and the upper shaft 8 was lowered so that the seed crystal was brought into contact with the melt. After the seed crystal was in contact with the melt, the temperature of the melt was adjusted to the temperature of crystal growth. Then, the single crystal was grown with the rate of pulling the upper shaft 8 at 3 mm/hr, the rate of rotation of the upper shaft 8 was 5 rpm, and the rate of rotation of the lower shaft 11 was 10 rpm. The steps from seeding to pulling were monitored by the X-ray imaging system. At this time, the voltage of the X-ray tube was 150 kV, and the current was 5 mA. The target for emitting the X-ray was Mo. As a result of the above described operation, a CdTe single crystal having a cylindrical body portion diameter of 52 mm and a length of 100 mm was obtained. The yield of pulling the single crystal was 60%.

On the other hand, a single crystal was pulled without using the first and second members, under the same conditions as above. However, a CdTe single crystal could not be grown.

Figure 23:
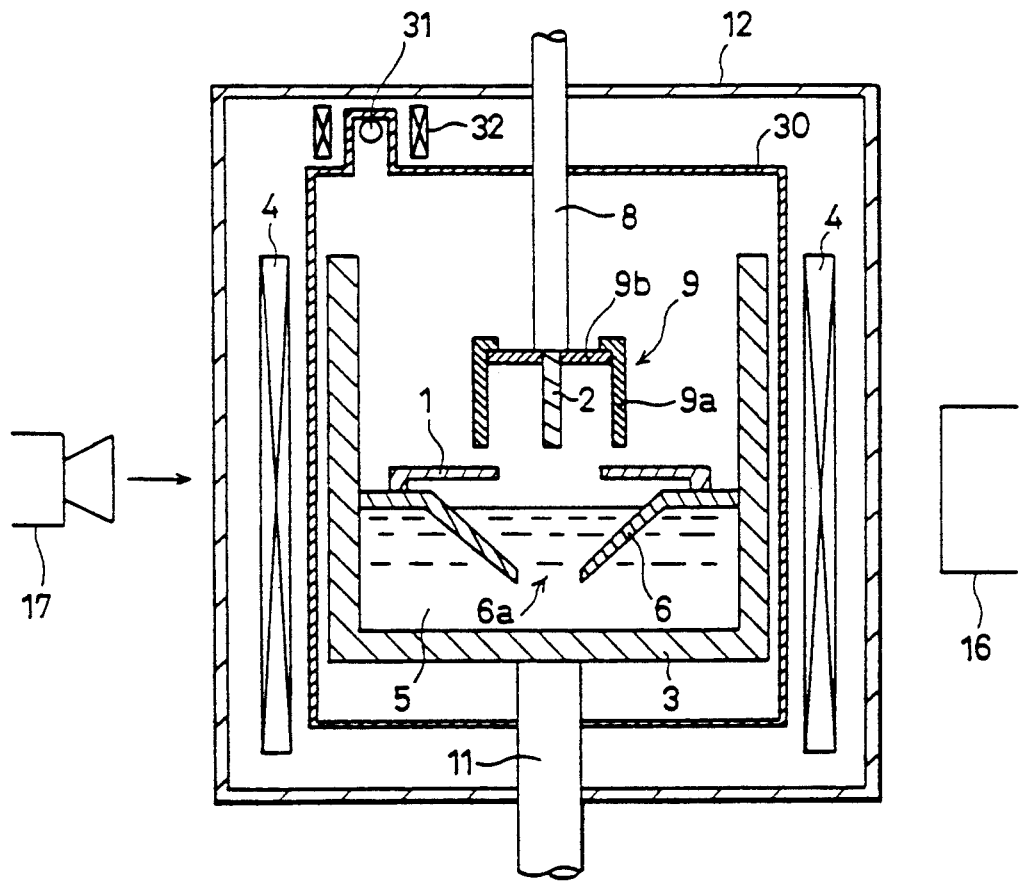
FIG. 23 is a schematic diagram showing an apparatus for manufacturing a single crystal used in the eleventh embodiment.

An eleventh embodiment of the present invention will be described in the following. FIG. 23 schematically shows the apparatus used in the eleventh embodiment Referring to FIG. 23, the apparatus includes an air-tight container 30 surrounding the crucible and the space for pulling the crystal above the crucible, in addition to the apparatus of the tenth embodiment. The upper shaft 8 and the lower shaft 11 extend into the air-tight container 30 while the air-tight state is maintained. A volatile constituent reservoir 31 is formed above the air-tight container 30. A heater 32 is provided around the volatile constituent reservoir 31. Although portions for passing the upper and lower shafts are not shown in the figure, a general structure employing a liquid encapsulant is employed.

A CdTe single crystal was grown by using the apparatus shown in FIG. 23. The air-tight container 30 was made of carbon coated with PBN. The seed crystal used was the same as that of the tenth embodiment. Portions of the apparatus were designed similar to those of the apparatus of the tenth embodiment except for the air-tight container. 1.0 kg of CdTe polycrystal was charged into the crucible and Cd was filled into the volatile constituent reservoir 31. The temperature of heater 32 was increased to 900° C. and Cd was filled into the air-tight container 30 which was pressurized to about 3atm. The chamber 12 was pressurized with Ar gas to the same pressure as the Cd in the air-tight container 30. The single crystal was pulled under the same condition as in the tenth embodiment. As a result, CdTe single crystal has been grown with the yield of 65%.

The apparatus for obtaining the X-ray image disclosed in the tenth and the eleventh embodiments may also be provided for the apparatuses shown in the second to ninth embodiments. By providing such apparatus, it becomes possible to monitor the steps of seeding to the growth of the single crystal also in the second to ninth embodiments. The air-tight container disclosed in the eleventh embodiment may be provided for the apparatuses of the second to ninth embodiments as well. When the air-tight container is used in the second to ninth embodiments, the single crystal can be grown in accordance with the Czochralski method by controlling the vapor pressure of volatile constituent.

As described above, by the present invention, from seeding to the formation of the shoulder portion of the single crystal in accordance with the Czochralski method, heat radiation from the surface of the melt to the space above the melt can be substantially intercepted. Therefore, in the method or apparatus of the present invention, the rapid growth of the crystal at the start of pulling can be sufficiently suppressed since the temperature gradient in the direction of pulling is small. Further, even when a crystal of a material having a low thermal conductivity, for example CdTe, is to be pulled, the rapid growth of the crystal while pulling the crystal can be sufficiently suppressed. Consequently, generation of a polycrystal and twins has been prevented. Therefore, by the method or apparatus of the present invention, a crystal having low dislocation density can be pulled. In addition, by controlling the diameter of the crystal to be grown with the aid of a coracle, a single crystal having a smooth shoulder portion can be grown. Further, by obtaining an X-ray image in the crucible by emitting X-rays through the crucible, the manner of pulling of the single crystal can be monitored, and accordingly, the shape of the single crystal being pulled can be effectively controlled. This invention provides a method and apparatus enabling manufacturing of a single crystal with a high production yield if the temperature gradient in the direction of pulling is small or even if the thermal conductivity of the crystal to be grown is small.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for manufacturing a single crystal, comprising:

a crucible for containing a raw material melt; a lower shaft for supporting said crucible; a heater arranged around said crucible for heating said crucible and melt; a coracle in said crucible, said coracle having a recess and an opening communicating with said melt of for containing raw material melt such that a surface area of said raw material melt in said coracle recess has a prescribed size; a rotatable and vertically movable upper shaft for holding a seed crystal at a lower end of said upper shaft for pulling a single crystal from said raw material melt; a first radiation intercepting member having a central hole through which said seed crystal is passed, said first heat radiation intercepting member resting initially on said coracle in a movable manner, said first member covering a melt surface of said raw material melt in said coracle for intercepting heat radiation from said raw material melt to a space above said melt surface; a second radiation intercepting member carried by said upper shaft and covering said central hole in said first intercepting member for further intercepting heat radiation through said central hole of said first radiation intercepting member, and means for moving said first intercepting member together with said second intercepting member and with said upper shaft upwardly when said single crystal is being pulled from said melt in said coracle recess.

2. The apparatus for manufacturing a single crystal according to claim 1, further comprising a third radiation intercepting member having an aperture through which said second radiation intercepting member is passed, said aperture covering said first radiation intercepting member for further intercepting heat radiation above said first radiation intercepting member.

3. The apparatus for manufacturing a single crystal according to claim 1, wherein said means for moving said first intercepting member comprise an integral construction of said first radiation intercepting member and said second radiation intercepting member.

4. The apparatus according to claim 1, wherein said first radiation intercepting member comprises a plurality of disk-shaped elements having central holes of different diameters, said elements forming a stack.

5. The apparatus according to claim 1, wherein said means for moving said first intercepting member comprise a diameter ratio $(D-d)/2$ within the range of 2 to 20 mm, where D denotes the diameter of said holes of said first radiation intercepting member and d denotes the diameter of a seed crystal, whereby said first intercepting member comes to rest on a single crystal being pulled thereby moving up as the single crystal is being pulled.

6. The apparatus for manufacturing a single crystal according to claim 1, wherein said first radiation intercepting member covers said raw material melt within 50 mm above the surface of said raw material melt.

7. The apparatus for manufacturing a single crystal according to claim 1, further comprising a liquid encapsulant on said raw material.

8. The apparatus for manufacturing a single crystal according to claim 1, further comprising an air-tight container for pulling said single crystal in an atmosphere of a volatile constituent.

9. The apparatus for manufacturing a single crystal according to claim 1, further comprising means for letting radiation from said heater to reach a surface of said raw material melt and a space above said raw material melt.

10. The apparatus for manufacturing a single crystal according to claim 9, wherein said means is a window formed in an upper portion of said crucible for passing radiation from said heater through said window.

11. The apparatus according to claim 1, wherein said means for moving said first intercepting member together with said second intercepting member comprise a smaller diameter of said central hole in said first intercepting member than a diameter of said single crystal, whereby said first intercepting member rests with an edge of said central hole on said single crystal when said upper shaft is being lifted for pulling said single crystal and said second intercepting member upwardly.

12. The apparatus according to claim 1, wherein said means for moving said first intercepting member together with said second intercepting member comprise a first diameter (D') for said surface area of melt in said coracle recess, said first diameter (D') being larger than a second diameter of said central hole in said first intercepting member, whereby said first intercepting member rests with an edge of said central hole on said single crystal when said upper shaft is being lifted for pulling said single crystal and said second intercepting member upwardly.

13. The apparatus of claim 12, wherein said coracle recess is conical whereby said first diameter (D') is determined by an extent to which said coracle dips into said melt.

14. The apparatus according to claim 12, whereby said coracle recess has a diameter which determines the size of said first diameter (D').

* * * * *